(12) United States Patent
Saitoh et al.

(10) Patent No.: US 8,106,382 B2
(45) Date of Patent: Jan. 31, 2012

(54) FIELD EFFECT TRANSISTOR

(75) Inventors: Tohru Saitoh, Osaka (JP); Takahiro Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 470 days.

(21) Appl. No.: 12/305,824

(22) PCT Filed: Jun. 18, 2007

(86) PCT No.: PCT/JP2007/062238
§ 371 (c)(1),
(2), (4) Date: Dec. 19, 2008

(87) PCT Pub. No.: WO2007/148653
PCT Pub. Date: Dec. 27, 2007

(65) Prior Publication Data
US 2010/0001259 A1 Jan. 7, 2010

(30) Foreign Application Priority Data
Jun. 21, 2006 (JP) .................. 2006-171017

(51) Int. Cl.
*H01L 29/66* (2006.01)
(52) U.S. Cl. .......... 257/24; 257/368; 257/E29.245; 438/3
(58) Field of Classification Search .......... 257/24, 257/E29.168, 25, 29, 368, E21.04, E29.245, 257/E29.255; 438/3, 493; 977/62
See application file for complete search history.

(56) References Cited

U.S. PATENT DOCUMENTS
2002/0117659 A1  8/2002  Lieber et al.
(Continued)

FOREIGN PATENT DOCUMENTS
JP  2006-093390  4/2006
(Continued)

OTHER PUBLICATIONS

Duan et al "High performance thin-film transistors using semiconductor nanowires and nanoribons" pp. 274-278 Letters to Nature vol. 425, Sep. 2003, Nature Publishing Group.

(Continued)

*Primary Examiner* — Thomas L Dickey
*Assistant Examiner* — Fazli Erdem
(74) *Attorney, Agent, or Firm* — McDermott Will & Emery LLP

(57) ABSTRACT

A source electrode 105 which is connected to a portion of at least one semiconductor nanostructure 103 among a plurality of semiconductor nanostructures, a drain electrode 106 connected to another portion of the semiconductor nanostructure 103, and a gate electrode 102 capable of controlling electrical conduction of the semiconductor nanostructure 103 are included. The semiconductor nanostructures 103 include a low concentration region 108 having a relatively low doping concentration and a pair of high concentration regions 107 having a higher doping concentration than that of the low concentration region 108 and being connected to both ends of the low concentration region 108. The doping concentration of the high concentration regions 107 is $1\times10^{19}$ cm$^{-3}$ or more; the length of the low concentration region 108 is shorter than a length of the gate electrode 102 along a direction from the source electrode 105 to the drain electrode 106; and the length of the gate electrode 102 is shorter than the interspace between the source electrode 105 and the drain electrode 106.

20 Claims, 16 Drawing Sheets

U.S. PATENT DOCUMENTS

| | | | |
|---|---|---|---|
| 2002/0172820 | A1 | 11/2002 | Majumdar et al. |
| 2004/0005723 | A1* | 1/2004 | Empedocles et al. ............. 438/1 |
| 2004/0241916 | A1* | 12/2004 | Chau et al. ................... 438/149 |
| 2006/0088960 | A1 | 4/2006 | Saito et al. |
| 2007/0155025 | A1* | 7/2007 | Zhang et al. ..................... 438/3 |
| 2008/0224122 | A1 | 9/2008 | Saitoh et al. |

FOREIGN PATENT DOCUMENTS

| | | |
|---|---|---|
| JP | 2006-128233 | 5/2006 |
| JP | 2006-507692 | 3/2008 |
| WO | WO 03/005450 A2 | 1/2003 |
| WO | WO 2004/032193 A1 | 4/2004 |

OTHER PUBLICATIONS

Menard et al "A Printable Form of Silicon for High Performance Thin Film Transistors of Plastic Substrates" pp. 5398-5400 Applied Physics Letters vol. 84, No. 25 American Institute of Physics Jun. 28, 2004.

Form PCT/ISA/416/409/ from PCT/JP2007/062238 with partial English Translation.

* cited by examiner (a)

(b)

(a)

(b)

(a)

(b)

(a)

(b)

FIELD EFFECT TRANSISTOR

RELATED APPLICATIONS

This application is the US National Phase under 35 U.S.C. §371 of International Application No. PCT/JP2007/062238 filed on Jun. 18, 2007, which claims the benefit of Japanese Application No. JP 2006-171017 filed on Jun. 21, 2006, the disclosures of which Applications are incorporated by reference herein.

TECHNICAL FIELD

The present invention relates to a field-effect transistor, and is applicable in a broad range such as displays, logic integrated circuits, and mobile devices.

BACKGROUND ART

Conventionally, semiconductor processing techniques such as lithography, vacuum evaporation, and etching have been used for the fabrication of transistors which drive or control display apparatuses such as liquid crystal displays and organic electro-luminescence displays. However, in view of desires for display apparatuses having an increased area, a problem exists in that use of such conventional processing techniques requires tremendous production equipment and increases the production cost. As a means for solving such problems, transistor production methods which utilize printing technique are drawing attention, in the place of conventional semiconductor processing techniques such as lithography, vacuum evaporation, and etching. Moreover, by using a flexible substrate such as plastic instead of the glass substrate which has mainly been used in the conventional techniques, it becomes possible to realize features such as thinness, lightweightness, and flexibility over conventional products. Therefore, methods of producing transistors on a flexible substrate are drawing attention.

As materials of conventional transistors for driving or controlling display devices, amorphous silicon and polysilicon have mainly been used. However, in current technology, these materials are subjected to film formation via vacuum processes such as a vapor phase deposition method and an evaporation method, and cannot be adapted to printing processes. Moreover, since a relatively high process temperature is required, there are constraints on the substrate material. For example, low-melting point materials, e.g., a plastic substrate, cannot be used.

As a means for solving these problems, a method has been proposed that disperses very small-sized single crystals of silicon in a solution to produce a "silicon ink", which is then applied on a substrate, thus fabricating a transistor composed of silicon crystals through a printing process. Non-Patent Document 1 discloses formation of a transistor through a printing process that uses silicon nanowires which are fabricated by a VLS growth technique as a material. Non-Patent Document 2 discloses formation of a transistor through a printing process which uses thin pieces of silicon that have been cut out from an SOI substrate as a material. By using these techniques, not only 1) low costs are realized based on a printing process, but also there are advantages in that 2) higher mobility and less variation than those of conventional amorphous silicon and polysilicon are realized because single crystals of silicon are used, and that 3) there is a much greater freedom of substrate material selection because silicon film formation near room temperature is enabled. Therefore, by using these techniques, it becomes possible to fabricate a high-performance transistor of single-crystalline silicon on a plastic substrate, for example, whereby novel devices that were not conventionally available can be realized, e.g., flexible displays.

[Non-Patent Document 1] "High-performance thin-film transistors using semiconductor nanowires and nanoribbons", Nature, vol. 425, 18 Sep. 2003, pp. 274-278.

[Non-Patent Document 2] "A printable form of silicon for high performance thin film transistors on plastic substrates", Applied Physics Letters, vol. 84, 28 Jun. 2004, pp. 5398-5400.

DISCLOSURE OF INVENTION

Problems to be Solved by the Invention

The method which produces a "silicon ink" by dispersing minute single crystals of silicon in a solution and applies it on a substrate to fabricate a transistor composed of silicon crystals through a printing process is very promising, but has the following problems in the conventional technique. The problems will be described with reference to FIG. 19 and FIG. 20, by taking as an example a case where a transistor is fabricated with the conventional technique by using silicon nanowires as semiconductor nanostructures.

FIG. 19 is a perspective view of an exemplary silicon nanowire transistor structure which is fabricated by using the conventional technique. FIG. 20 is an upper plan view of a silicon nanowire transistor which is fabricated by using the conventional technique as well as a cross-sectional structural diagram taken along line A-A'. A gate electrode 302 is formed on a substrate 301, and silicon nanowires 303 are disposed via a gate insulating film 304. The ends of the silicon nanowires 303 are connected to a source electrode 305 and a drain electrode 306. By applying a gate voltage to the gate electrode 302, the charge of a channel which is formed in the semiconductor nanowires 303 is controlled, whereby a transistor operation occurs. The semiconductor nanowires 303 can be fabricated by using another substrate in advance with a growth method such as that described in e.g. Non-Patent Document 1, and thereafter transferred and placed onto the substrate 301.

However, the silicon nanowire transistor according to the conventional technique has the following problems. A first problem is that the channel length of the transistor is solely determined by the processing dimensions of the gate electrode, source and drain electrodes, and the like, which makes it impossible to realize a channel length which is equal to or less than the minimum processing dimension. In FIG. 20(b), among the semiconductor nanowires 303, the length (channel length) of a channel region 307, which is a region whose carrier concentration is governed by the gate electrode, is determined by the processing dimension of the gate electrode. A drain current ID in a saturation region of a metal-oxide film-semiconductor (MOS) transistor is generally expressed by the following equation.

$$ID = (½) \cdot (W/L) \cdot \mu C_i \cdot (V_G - V_T)^2$$

Herein, W, L, μ, Ci, VG, and VT are, respectively, channel width, channel length, channel mobility, gate insulating film capacitance, gate voltage, and threshold voltage. As the channel length L decreases, the ID increases, whereby the transistor characteristics are improved. The processing precision of photolithography is on the order of less than 1 μm in the case of using a glass substrate, and about 5 to 10 μm in the case of using a flexible substrate having contraction and expansion abilities and surface irregularities. In the case where photolithography is not used but a printing technique such as ink jet or screen printing is used for the processing of electrodes, micromachining becomes particularly difficult, and the processing precision in current technology is about 30 to 50 µm. Moreover, if the dimension of the channel length L varies due to processing variations of the transistor, the processing variations will straightforwardly become ID variations. In the case where transistors are used for driving the pixels of a display, for example, variations of the transistor will be a direct cause of brightness variations of the pixels, and so on. Therefore, in the nanowire transistor according to the conventional technique as shown in FIG. 19 and FIG. 20, when the transistor is fabricated by using a flexible substrate and a printing technique, there is a problem of inevitable deteriorations and variations in the transistor characteristics due to the deteriorated processing precision.

A second problem is that it is difficult to lower the contact resistances with the source electrode and the drain electrode. In the nanowire transistor according to the conventional technique as shown in FIG. 19 and FIG. 20, the silicon nanowires 303 are uniformly doped in their entirety. Since the semiconductor nanowires 303 form a channel, a threshold voltage of the transistor is controlled based on doping concentration. Therefore, the doping concentration needs to be set to $10^{15}$ to $10^{18}$ cm$^{-3}$. However, in such a low-concentration doping, it is known to be difficult to form low-resistance ohmic contacts with the source electrode and the drain electrode. A technique is known which performs a high-concentration doping in the contact regions by using an ion implantation and a heat treatment so as to lower the contact resistance. However, since a heat treatment temperature of usually about 700° C. or more is required, application to a flexible substrate of plastic or the like is not possible. Therefore, in the case of fabricating a nanowire transistor on a flexible substrate by using the conventional technique, there is a problem of inevitable deteriorations in the transistor characteristics due to the increased resistances of contacts.

A third problem is an increase in the channel resistance due to offsets. In the nanowire transistor according to the conventional technique as shown in FIG. 20, offset regions 308 which are not governed by the gate electrode exist in portions of the silicon nanowires 303. Since the offset regions 308 are not governed by the gate electrode, carriers are not induced even during an ON operation of the transistor, so that the channel resistance is increased. The conventional technique avoids formation of offsets by using an ion implantation and a heat treatment; however, in the case where a flexible substrate is used as described earlier, it is impossible to use any process that requires a high temperature. According to another conventional technique, offsets can be avoided by using a transistor structure shown in FIG. 21. By allowing the gate electrode to overlap, from the source electrode to the drain electrode, a channel across the entire semiconductor nanowires 303 can be formed with the gate electrode, thereby avoiding formation of offsets. However, in this structure, parasitic capacitances between the gate electrode and the source electrode, the drain electrode, and the channel are increased, thus causing a problem of hindering the high-frequency operation of the transistor. Therefore, it is not preferable to employ the transistor structure shown in FIG. 21. Although the transistor structures shown in FIG. 19 and FIG. 20 are preferable, a problem of the conventional technique exists in that an increase in the channel resistance due to formation of the offsets is inevitable.

Means for Solving the Problems

A field-effect transistor according to the present invention is a field-effect transistor comprising: a substrate; a plurality of semiconductor nanostructures supported by the substrate; a source electrode connected to a portion of at least one semiconductor nanostructure among the plurality of semiconductor nanostructures; a drain electrode connected to another portion of the at least one semiconductor nanostructure; an insulating film adjoining the at least one semiconductor nanostructure and functioning as a gate insulating film; and a gate electrode being capable of controlling electrical conduction of the at least one semiconductor nanostructure via the insulating film, wherein, each of the plurality of semiconductor nanostructures includes a low concentration region having a relatively low doping concentration and a pair of high concentration regions having a higher doping concentration than that of the low concentration region and being connected to both ends of the low concentration region; the doping concentration of the high concentration region is $1 \times 10^{19}$ cm$^{-3}$ or more; and a length of the low concentration region is shorter than a length of the gate electrode along a direction from the source electrode to the drain electrode, and the length of the gate electrode is shorter than an interspace between the source electrode and the drain electrode.

In a preferred embodiment, one of the pair of high concentration regions of the at least one semiconductor nanostructure is connected to the source electrode; the other of the pair of high concentration regions is connected to the drain electrode; and at least a portion of the low concentration region has an overlap with the gate electrode.

In a preferred embodiment, one of the pair of high concentration regions of the at least one semiconductor nanostructure is connected to the source electrode; the other of the pair of high concentration regions is connected to the drain electrode; and the entire low concentration region has an overlap with the gate electrode.

In a preferred embodiment, the following relational expression is satisfied: $(L_{gate} - L_{channel}) > (L_{wire} - L_{SD})$, where: $L_{wire}$ is a length of the semiconductor nanostructure; $L_{channel}$ is the length of the low concentration region; $L_{gate}$ is the length of the gate electrode; and $L_{SD}$ is the interspace between the source electrode and the drain electrode.

In a preferred embodiment, the following relational expression is satisfied: $(L_{gate} + L_{channel}) > (L_{wire} - L_{SD})$, where: $L_{wire}$ is a length of the semiconductor nanostructure; $L_{channel}$ is the length of the low concentration region; $L_{gate}$ is the length of the gate electrode; and $L_{SD}$ is the interspace between the source electrode and the drain electrode.

In a preferred embodiment, the doping concentration of the high concentration region is from $1 \times 10^{19}$ to $1 \times 10^{22}$ cm$^{-3}$; and the doping concentration of the low concentration region is 10% or less of the doping concentration of the high concentration region.

In a preferred embodiment, the doping concentration of the low concentration region is from $1 \times 10^{15}$ to $1 \times 10^{19}$ cm$^{-3}$.

In a preferred embodiment, the plurality of semiconductor nanostructures include at least one semiconductor nanostructure which has no overlap with one of the source electrode and the drain electrode.

In a preferred embodiment, the low concentration region of the at least one semiconductor nanostructure which has no overlap with one of the source electrode and the drain electrode has no overlap with the gate electrode.

In a preferred embodiment, the semiconductor nanostructure is a semiconductor nanowire.

In a preferred embodiment, the semiconductor nanostructure is a semiconductor nanowire which is fabricated by vapor-liquid-solid growth (VLS growth).

In a preferred embodiment, the semiconductor nanostructure is a silicon nanowire which is fabricated by vapor-liquid-solid growth (VLS growth).

In a preferred embodiment, the substrate is made of an organic material.

Effects Of The Invention

According to the present invention, a channel length which is equal to or less than the processing precision can be realized and suppression of variations can be realized, which have been the problems of conventional techniques. Moreover, contact resistances with the source electrode and the drain electrode can be lowered, and an increase in channel resistance due to offsets can be eliminated.

Figure 1:
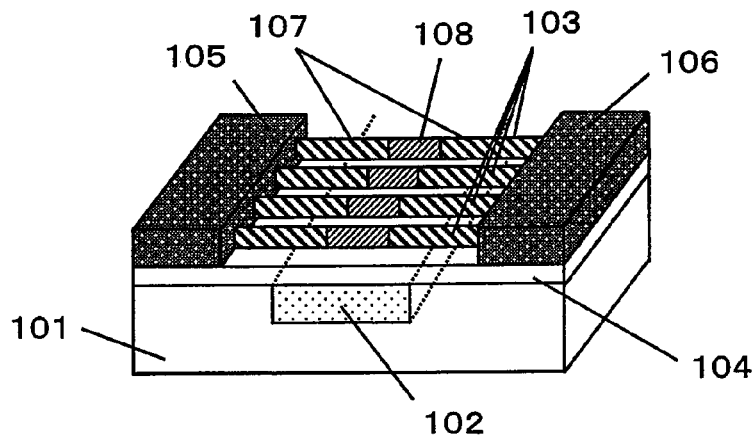
[FIG. 1] A perspective view of a bottom-gate type transistor structure according to the present invention.

DESCRIPTION OF THE REFERENCE NUMERALS 101 substrate
102 gate electrode
103 semiconductor nanostructure
104 insulating film
105 source electrode
106 drain electrode
107 high-doping concentration region
108 low-doping concentration region
109 mask
110 gate electrode formation region
111 gate metal
201 substrate
202 metal catalyst microparticles
203 source gas
204 silicon nanowire
205 n-dopant gas
206 p-dopant gas
207 drain current-gate voltage characteristics where displacement is 0 μm
208 drain current-gate voltage characteristics where displacement is 0.5 μm
209 drain current-gate voltage characteristics where displacement is 1.0 μm
210 drain current-gate voltage characteristics where displacement is 1.5 μm
211 OFF current
212 ON current
301 substrate
302 gate electrode
303 nanowire
304 insulating film
305 source electrode
306 drain electrode
307 channel region
308 offset region

BEST MODE FOR CARRYING OUT THE INVENTION

Figure 3:
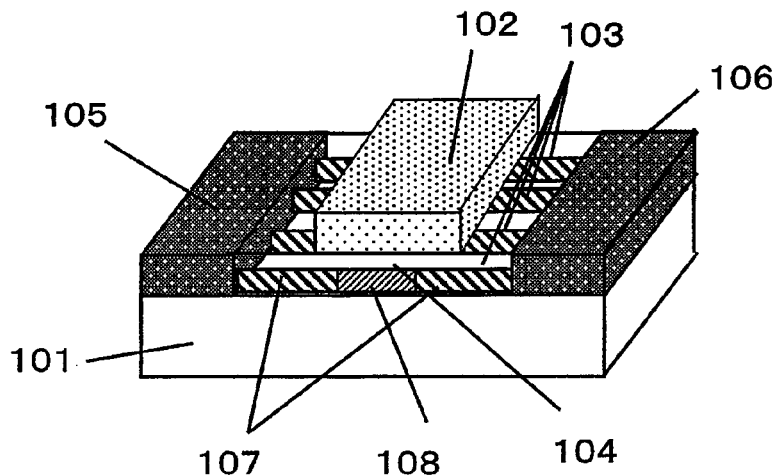
[FIG. 3] A perspective view of a top-gate type transistor structure according to the present invention.
Figure 4:
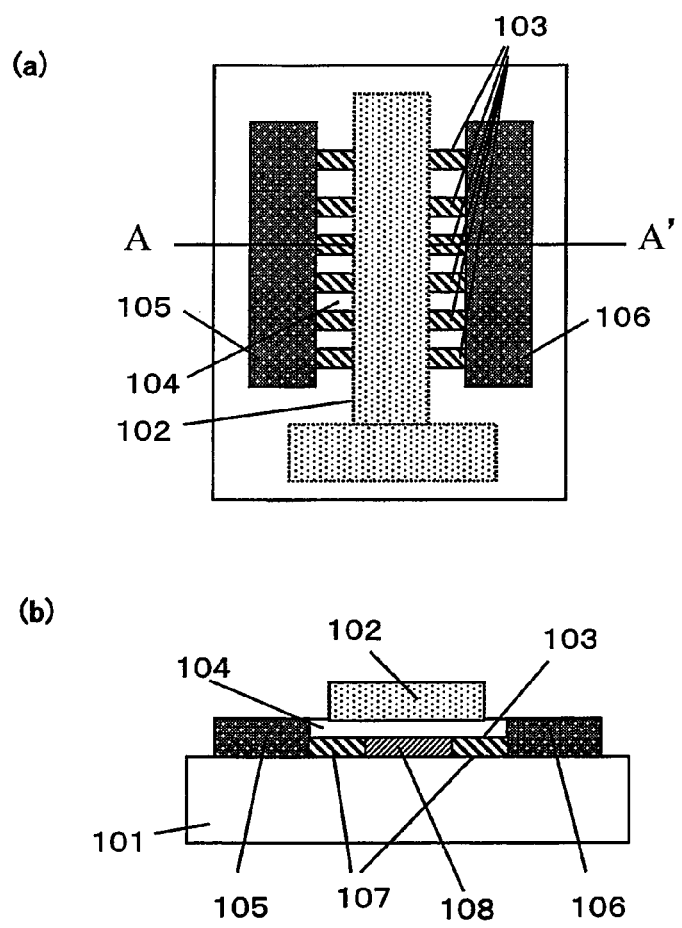
[FIG. 4] (a) is an upper plan view of a top-gate type transistor structure according to the present invention; and (b) is a cross-sectional view taken along line A-A'.

Hereinafter, with reference to the drawings, the construction of a transistor structure according to the present invention will be described. FIG. 1 shows an exemplary perspective view of a bottom-gate type transistor structure according to the present invention. FIGS. 2(a) and (b) are, respectively, an upper plan view and a cross-sectional view taken along line A-A' of the transistor shown in FIG. 1. FIG. 3 shows an exemplary perspective view of a top-gate type transistor structure according to the present invention. FIGS. 4(a) and (b) are, respectively, an upper plan view and a cross-sectional view taken along line A-A' of the transistor shown in FIG. 3.

It is constructed on a substrate 101, from semiconductor nanostructures 103 each having a channel layer in at least a portion thereof, a source electrode 105 and a drain electrode 106 connected to the semiconductor nanostructures 103, an insulating film 104 adjoining the semiconductor nanostructures 103 and functioning as a gate insulating film, and a gate electrode 102 capable of controlling electrical conduction of the semiconductor nanostructures 103 via the insulating film 104. The transistor is constructed by using a plurality of semiconductor nanostructures 103. The most fundamental feature of the present invention is that at least two or more regions of different doping concentrations are formed in each semiconductor nanostructure 103, and that the doped regions are disposed in a suitable manner for allowing the characteristics of the transistor to be exhibited.

High-doping concentration regions 107 are formed at both ends of each semiconductor nanostructure 103, and a region 108 with a doping concentration which is lower than that of the high-doping concentration regions 107 is formed in the central portion of the semiconductor nanostructure 103. The high-doping concentration regions 107 have a doping concentration of $1 \times 10^{19}$ cm$^{-3}$ or more.

The high-doping concentration regions 107 and the low-doping concentration region 108 may have the same conductivity type (i.e., the regions 107 and 108 both being p-type or both being n-type), or the high-doping concentration regions 107 and the low-doping concentration region 108 may have opposite conductivity types (i.e., the regions 107 being p-type and the region 108 being n-type, or the regions 107 being n-type and the region 108 being p-type). It is desirable that the low-doping concentration region 108 is located in the center of the semiconductor nanostructure 103, such that the high-doping concentration regions 107 are formed symmetrically with the low-doping concentration region 108 interposed therebetween.

In at least one of the semiconductor nanostructures 103, the high-doping concentration regions 107 which are formed at both ends are respectively connected to the source electrode 105 and the drain electrode 106. Moreover, in at least one of the semiconductor nanostructures 103, the low-doping concentration region 108 has an overlap with the gate electrode 102 via the insulating film 104. In other words, in the bottom-gate type transistor shown in FIG. 1 and FIG. 2, the low-doping concentration region 108 of at least one of the semiconductor nanostructures 103 is formed entirely over the gate electrode 102. Alternatively, a portion of the low-doping concentration region 108 of at least one of the semiconductor nanostructures 103 is formed over the gate electrode 102. On the other hand, in the top-gate type transistor shown in FIG. 3 and FIG. 4, the low-doping concentration region 108 of at least one of the semiconductor nanostructures 103 is formed entirely under the gate electrode 102. Alternatively, a portion of the low-doping concentration region 108 of at least one of the semiconductor nanostructures 103 is formed under the gate electrode 102.

Figure 5:
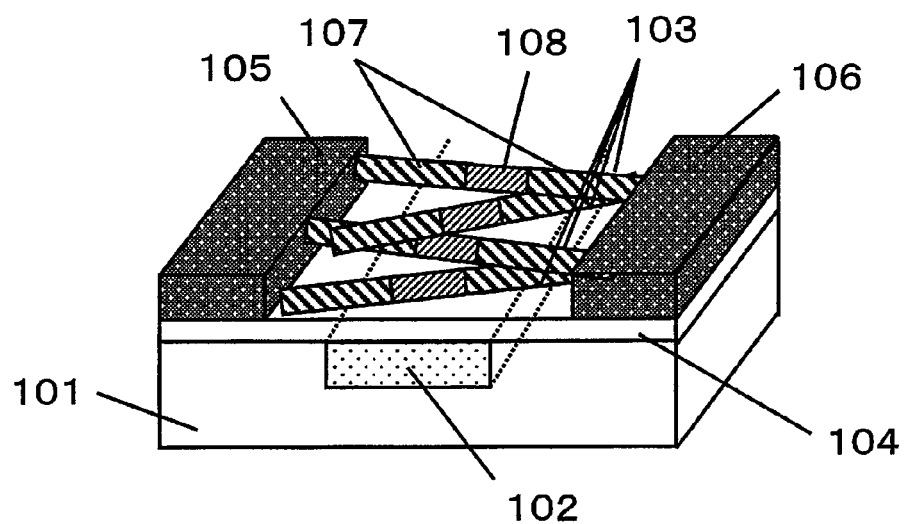
[FIG. 5] A perspective view of a bottom-gate type transistor structure according to the present invention.
Figure 6:
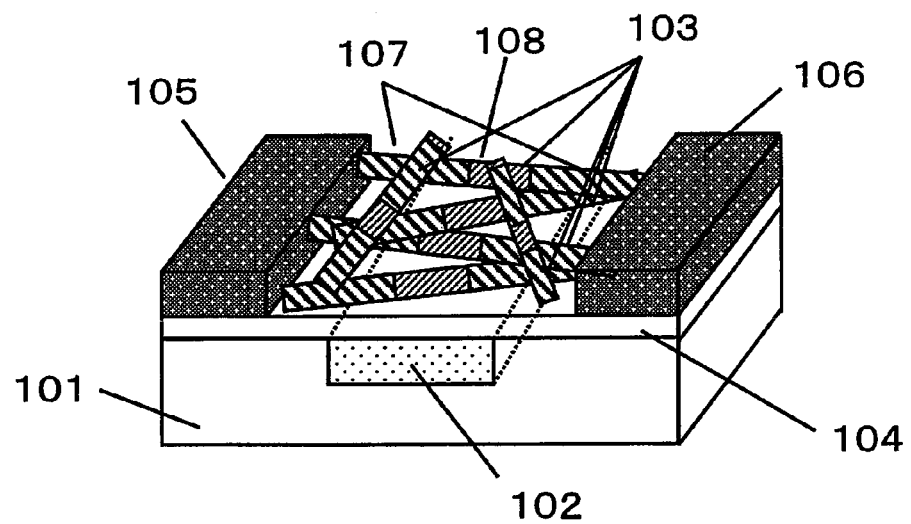
[FIG. 6] A perspective view of a bottom-gate type transistor structure according to the present invention.

The exemplary transistors according to the present invention shown in FIG. 1 to FIG. 4 demonstrate examples where the semiconductor nanostructures 103 are aligned from the source electrode to the drain electrode. Although such an aligned arrangement is ideal, it is not a necessary condition in the present invention. For example, as shown in FIG. 5, the semiconductor nanostructures 103 may have variations in their positioning directions rather than being aligned, and there may be overlaps between semiconductor nanostructures 103. Moreover, as shown in FIG. 6, some of the semiconductor nanostructures 103 may have no connection with the source electrode or the drain electrode. While FIG. 5 and FIG. 6 illustrate examples of bottom-gate type transistors, the same is also true of top-gate type transistors: the semiconductor nanostructures 103 may have variations in their positioning directions rather than being aligned; there may be overlaps between semiconductor nanostructures 103; and some of the semiconductor nanostructures 103 may have no connection with the source electrode or the drain electrode.

A transistor according to the present invention can solve the problems of the conventional technique in the following aspects. Firstly, a channel length which is equal to or less than the processing precision can be realized, and suppression of variations can be realized. In a transistor according to the present invention, the high-doping concentration regions 107 formed at both ends of each semiconductor nanostructure 103 are hardly influenced by the gate electrode 102, but essentially function as portions of the source electrode 105 and the drain electrode 106. For example, if the doping concentration of the high-doping concentration regions 107 is $1 \times 10^{19}$ cm$^{-3}$ or more, the carrier depletion due to an electric field which is applied to the gate electrode 102 is negligibly small, and therefore the high-doping concentration regions 107 can always keep a low resistance state. Moreover, if the impurity of the high-doping concentration regions 107 remains at a concentration of about $1 \times 10^{22}$ cm$^{-3}$, doping easily occurs without deteriorating the crystallinity of the semiconductor nanostructures 103.

As a result, the so-called channel portion, in which the carriers are controlled by the gate electrode 102, corresponds only to the low-doping concentration region 108. As will be described later, through control of the crystal growth, the dimensions of the low-doping concentration region 108 can be controlled with a precision of about 0.1 µm or less. In the conventional techniques, the channel length is determined by the processing precision of the gate electrode as mentioned above, and in the case of processing using photolithography, the processing precision when using a glass substrate is on the order of less than about 1 µm, and the processing precision when using a flexible substrate having surface irregularities and contraction and expansion is about 5 to 10 µm. In the case where photolithography is not used but a printing technique such as ink jet or screen printing is used for the processing of electrodes, micromachining becomes particularly difficult, and the processing precision in current technology is about 30 to 50 µm. In contrast, in a transistor according to the present invention, the dimensions of the low-doping concentration region 108 can be made shorter than the length of the gate electrode, thus making it possible to form a channel with a much finer precision and suppressed variations. Thus, the characteristics of the transistor are greatly improved.

Moreover, as shown in FIG. 5, in the case where the semiconductor nanostructures 103 have discrepancies in their positioning in a direction of rotating from the direction from the source electrode 105 toward the drain electrode 106, the channel length is solely determined by the dimensions of each low-doping concentration region 108, and thus is not a cause of variations. On the other hand, in a conventional transistor which is not subjected to doping, the discrepancies of the semiconductor nanostructures 103 in a rotating direction may substantially change the length of each semiconductor nanostructure 103 that is governed by the gate electrode 102, and thus the positioning discrepancies will be a direct cause of characteristics variations. This is another aspect where use of a transistor according to the present invention suppresses characteristics variations.

A second aspect in which a transistor according to the present invention can solve the problems of the conventional techniques is that contact resistances with the source electrode and the drain electrode can be lowered. In a transistor according to the conventional technique, the doping concentration needs to be set to $10^{17}$ to $10^{18}$ cm$^{-3}$ from the standpoint of threshold voltage control. On the other hand, in a transistor according to the present invention, threshold voltage control is performed at the low-doping concentration region 108, so that the doping concentration of the high-doping concentration regions 107 can be set freely, independently from the threshold voltage. Specifically, about $1\times10^{19}$ to $1\times10^{22}$ cm$^{-3}$ of doping is possible. It is known that, generally speaking, when the doping concentration of a contact region exceeds about $1\times10^{19}$ cm$^{-3}$, a good ohmic contact can be obtained because a current exceeding the contact junction barrier flows due to a tunneling current, among other reasons. Therefore, as compared to the conventional techniques, a great reduction in contact resistance can be realized. Note that, in the present invention, doping of the semiconductor nanostructures 103 is performed in advance by utilizing crystal growth as will be described later, and therefore contact formation can be achieved without using a high temperature process. Therefore, the present technique is easily applicable to flexible substrates and the like, too.

A third aspect in which a transistor according to the present invention can solve the problems of the conventional techniques is that an increase in channel resistance due to offsets can be eliminated. In a transistor according to the present invention, the regions of each semiconductor nanostructure 103 that are not governed by the gate electrode 102 are constituted by the high-doping concentration regions 107, and therefore have a low resistance and do not undergo an increase in channel resistance.

Thus, according to the present invention, transistor characteristics which are greatly improved over the conventional techniques can be realized.

Note that the doping concentration in the semiconductor nanostructures 103 can be measured through an analysis using a high-resolution secondary ion-microprobe mass spectrometer or a micro-Raman spectroscopy apparatus.

Figure 7:
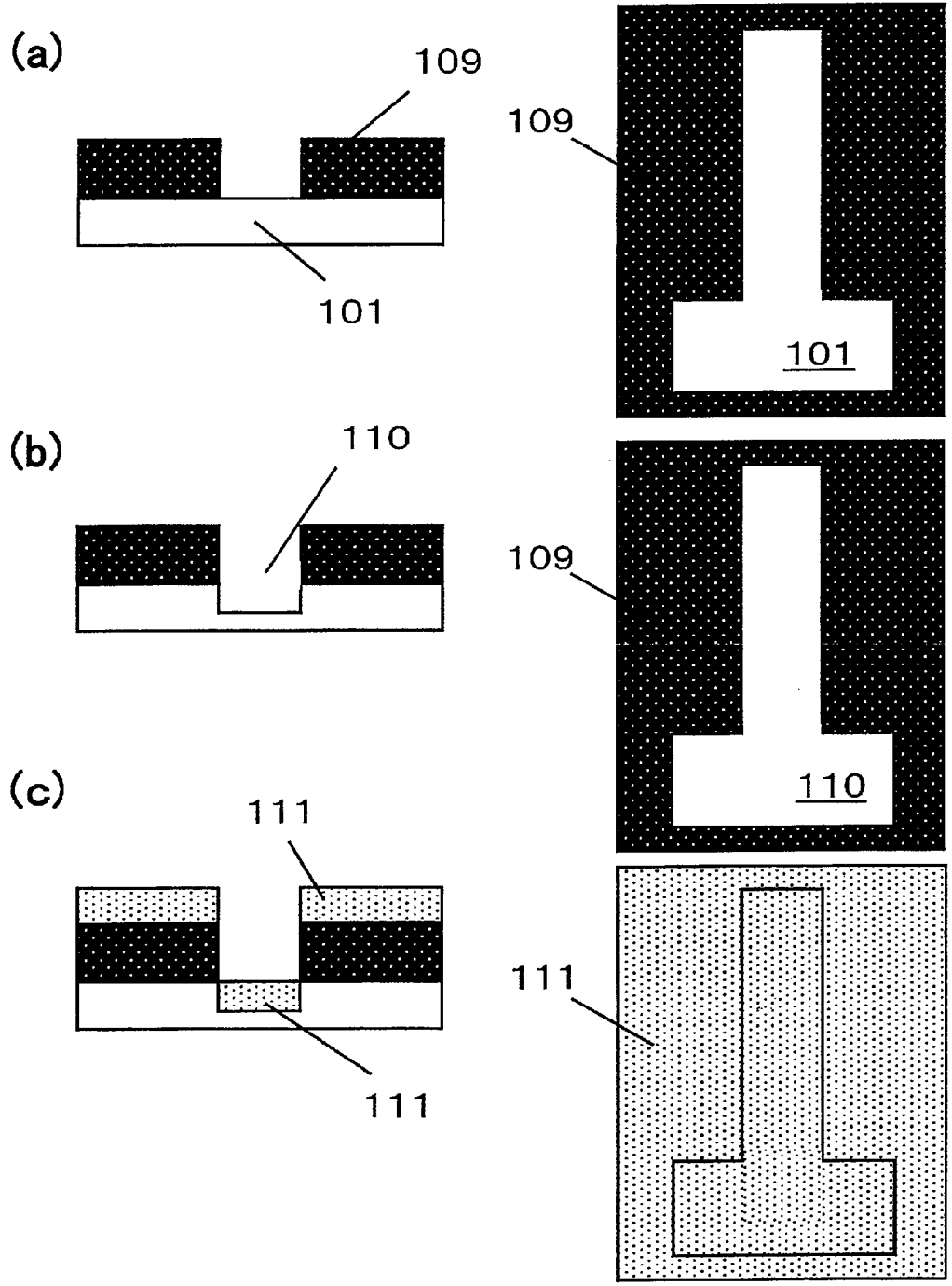
[FIG. 7] (a) to (c) are step diagrams showing a production method of a bottom-gate type transistor according to the present invention.
Figure 8:
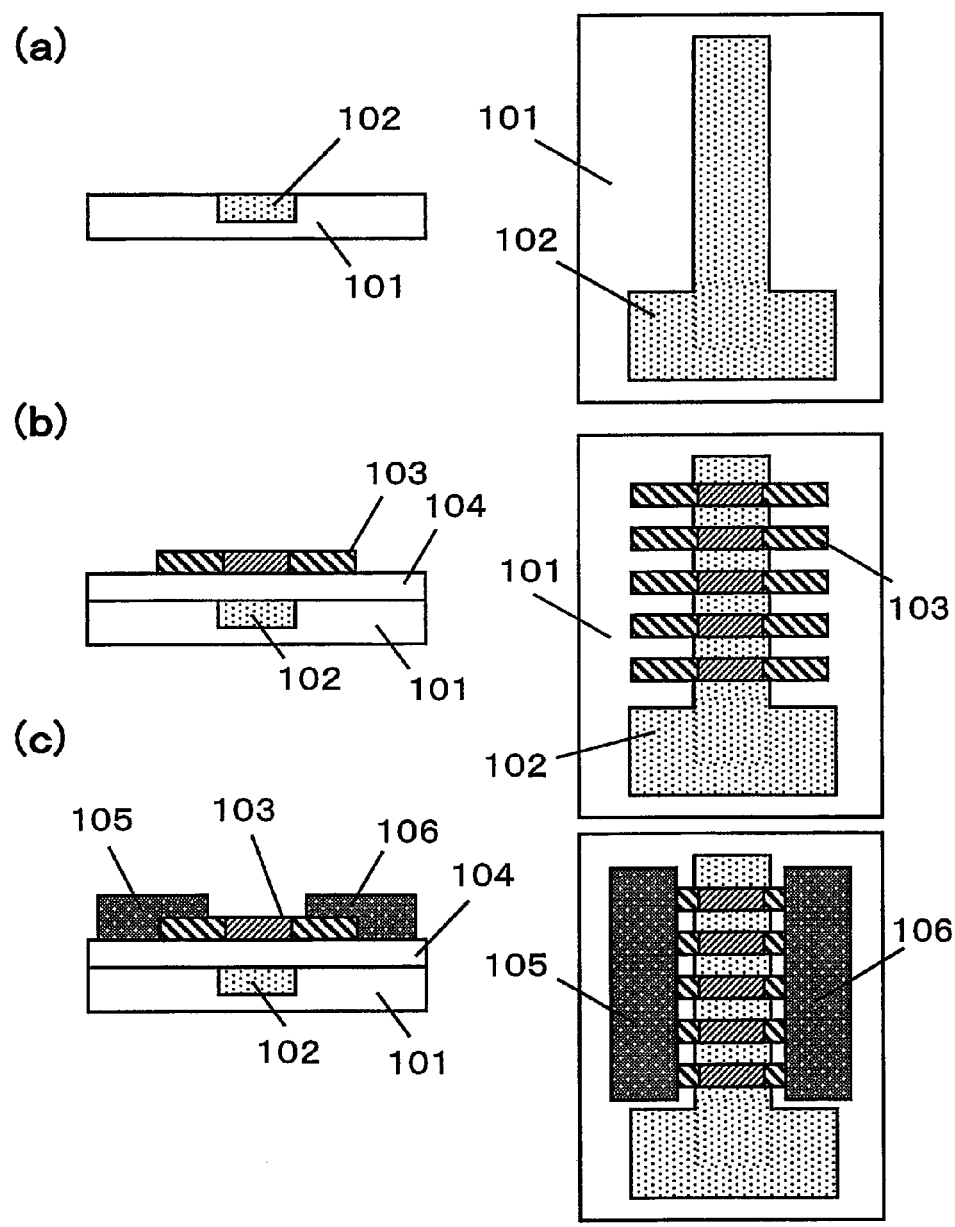
[FIG. 8] (a) to (c) are step diagrams showing a production method of a bottom-gate type transistor according to the present invention.

Now, a production method for a transistor according to the present invention will be described. Herein, the production method will be illustrated by taking as an example the bottom-gate type transistor shown in FIG. 1 to FIG. 2 or FIG. 5 to FIG. 6. A case will be described where silicon nanowires are used as examples of semiconductor nanostructures. FIG. 7 and FIG. 8 are a schematic plan view showing a production method for a bottom-gate type transistor according to the present invention and a schematic cross-sectional view taken along line A-A'.

FIG. 7(a) to FIG. 8(a) show a production method for a gate electrode 102. First, as shown in FIG. 7(a), a region for forming the gate electrode 102 is defined on a substrate 101 with a mask 109. As a method for forming the mask 109, a patterning method by an existing technique can be used, e.g. a printing technique such as photolithography or ink jet. Next, by etching the substrate 101 as shown in FIG. 7(b), a gate electrode formation region 110 is formed. As a method of etching, dry etching or wet etching is used. In the transistor according to the present invention, the material of the substrate 101 is preferably plastic (organic material), glass, or silicon, but is not limited thereto. The material of the substrate 101 may be any arbitrary material, without being limited in terms of differences between organic substance/inorganic substances, presence or absence of electrical conductivity, and the like. In this case, by using an etching method which is suited to the substrate 101, it is possible to form the gate electrode formation region 110 with an existing technique. Next, as shown in FIG. 7(c), a gate metal 111 is deposited. As a method of deposition, a sputtering technique, an evaporation technique, or a method of applying a metal particle ink can be used. Next, the mask 109 and the gate metal 111 having been deposited on the mask 109 are removed by lift-off as shown in FIG. 8(a), whereby the gate electrode 102 can be formed on the substrate 101. Although the material of the gate electrode 102 is not particularly limited, a metal material such as gold, aluminum, titanium, or tungsten, a semiconductor material such as silicon, an electrically-conductive organic substance, or the like can be used. Typical dimensions may be as follows: a gate length of 2 μm to 20 μm, a gate width of 20 μm to 200 μm, and a gate electrode thickness of about 200 nm to 500 nm. As a method of ensuring that the gate electrode 102 and the substrate 101 are about equal in height, the deposited film thickness of the gate metal 111 may be set to be about the same as the depth of the gate electrode formation region 110. When the deposited film thickness of the gate metal 111 is set to be about the same as the depth of the gate electrode formation region 110, there is an advantage in that the planarity of the transistor is improved and that the transistor becomes easy to fabricate. However, in FIG. 7, the gate electrode 102 and the substrate 101 are shown as having an equal height, but it is not a necessary condition of the present invention for the gate electrode 102 and the substrate 101 to be equal in height; the effects of the present invention can be similarly obtained even if their heights are not the same. For example, without forming the gate electrode formation region 110, the gate electrode 102 may be formed on the surface of the substrate 101.

Next, as shown in FIG. 8(b), an insulating film 104 and semiconductor nanostructures 103 are sequentially formed on the substrate 101 on which the gate electrode 102 has been formed. As the material of the insulating film 104, any kind of insulation material may be used, e.g., an inorganic material such as a silicon oxide film, a silicon nitride film, aluminum oxide, tantalum oxide, or hafnium oxide, and an organic material such as polyimide. As the method of formation, existing techniques such as a sputtering technique or an application method by spin-coating can be used. The typical film thickness of the insulating film 104 is about 100 nm to 500 nm.

Figure 9:
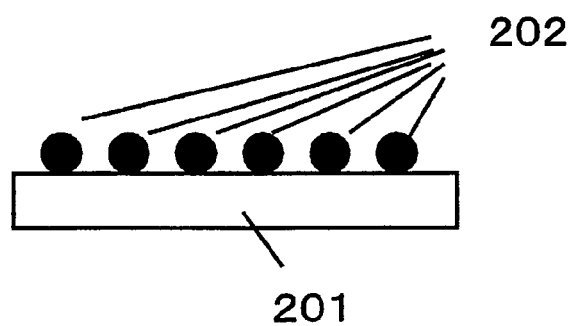
[FIG. 9] (a) and (b) are step-by-step cross-sectional views showing a production method of silicon nanowires as semiconductor nanostructure.
Figure 9:
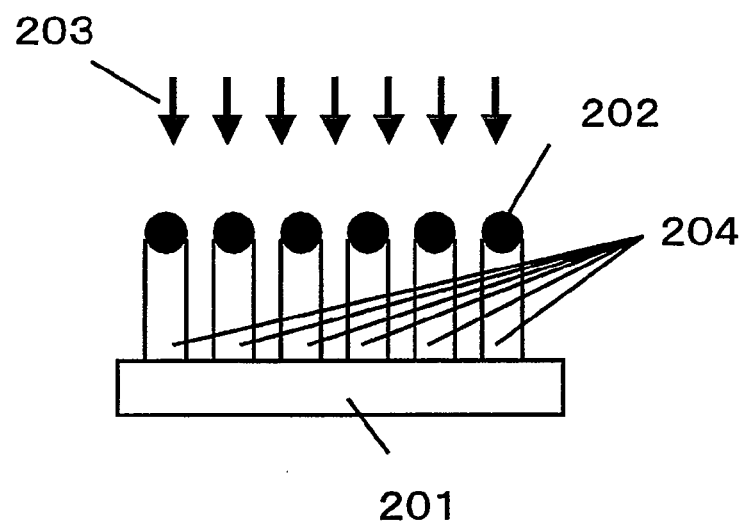

Production of the semiconductor nanostructures 103 and their positioning on the insulating film 104 are main elements of the present invention, and therefore will be described in detail by using other figures. Hereinafter, a method for producing semiconductor nanostructures 103 that are made of silicon will be described with reference to FIG. 9. As a production method for silicon nanowires, a vapor-liquid-solid (VLS) growth technique can be used. Growth of silicon nanowires by a VLS growth technique is disclosed also in Non-Patent Document 1, for example, and is a well-known technique. As shown in FIG. 9(a), metal catalyst microparticles 202 are formed on a substrate 201 for growing nanowires. As the material of the substrate 201, a silicon substrate, a silicon substrate having a thermal oxide film formed on its surface, or the like can be used. As the metal catalyst microparticles 202, microparticles of gold with a diameter of about 10 nm to 100 nm can be used, for example; however, cobalt, nickel, platinum, or the like can also be used. As the method of forming the metal catalyst microparticles 202, a colloidal solution of the metal catalyst microparticles 202 may be applied onto the substrate 201 by spin-coating, for example; however, any technique is applicable that is capable of forming similar shapes.

Next, as shown in FIG. 9(b), by supplying a source gas 203 while maintaining the substrate 201 at a predetermined substrate temperature, silicon nanowires 204 can be grown. The substrate temperature during growth is about 350° C. to 500° C.; and $SiH_4$, $Si_2H_6$, or the like is used as the source gas 203. The source gas may be diluted with hydrogen, helium, or the like. As for the growth pressure, growth can occur in a region from about 0.001 Torr to about atmospheric pressure, but a range from about 0.001 Torr to 10 Torr is preferable.

A feature of the present invention is that, as shown in FIG. 1, high-doping concentration regions 107 and a low-doping concentration region 108 are formed within each semiconductor nanostructure 103. A method for producing silicon nanowires having such regions of different doping concentrations will be described. A method for growing silicon nanowires in which the high-doping concentration regions 107 is n-type and the low-doping concentration region 108 is p-type will be described with reference to FIG. 10 and FIG. 11. After the metal catalyst microparticles 202 are formed on the substrate 201 (FIG. 10(a)), $Si_2H_6$ is supplied as the source gas 203 and $PH_3$ is supplied as an n-dopant gas 205, while maintaining the substrate temperature at about 450° C. As a result, $Si_2H_6$ is decomposed so that silicon nanowires grow, and $PH_3$ is decomposed so that P (which is an n-dopant) is taken into the silicon nanowires, whereby a high-doping concentration region 107 of n-type is formed (FIG. 10(b)). At this time, by controlling the partial pressure ratio between $Si_2H_6$ and $PH_3$, it is possible to control the P concentration within the silicon nanowires. For example, by setting the partial pressure ratio between $Si_2H_6$ and $PH_3$ at 50:1 to 5000:1, it becomes possible to form silicon nanowires having a P concentration of about $1\times10^{19}$ to $1\times10^{22}$ $cm^{-3}$.

After supplying $Si_2H_6$ as the source gas 203 and $PH_3$ as the n-dopant gas 205 for a predetermined time, $B_2H_6$ is supplied as the p-dopant gas 206 instead of the n-dopant gas 205, while still supplying $Si_2H_6$ as the source gas 203. At this time, the B concentration in the silicon nanowires can be controlled by controlling the partial pressure ratio between $Si_2H_6$ and $B_2H_6$. For example, by setting the partial pressure ratio between $Si_2H_6$ and $B_2H_6$ at 50000:1 to 500000:1, silicon nanowires having a B concentration of about $1\times10^{15}$ to $1\times10^{19}$ $cm^{-3}$ can be formed. As a result, a p-type low-doping concentration region 108 is formed so as to be continuous with the n-type high-doping concentration region 107 (FIG. 11(a)). Note that the doping concentration of the region 108 only needs to be lower than the doping concentration of the region 107, and the doping concentration of the region 108 is preferably 10% or less of the doping concentration of the region 107. Particularly from the standpoint of setting the threshold voltage of the transistor to a more appropriate value, it is preferable that the doping concentration of the region 108 is in the range from $1\times10^{15}$ to $1\times10^{19}$ $cm^{-3}$.

Note that the boundary between the region 107 and the region 108 does not need to be clear. In other words, the doping concentration does not need to change steeply between the regions 107 and 108, and may change gently. Stated otherwise, between a region with a relatively high doping concentration and a region with a relatively low doping concentration, there may be a transitional region where the concentration changes gradually or in a stepwise manner. In the case where such a transitional region exists, any region whose doping concentration is $1\times10^{19}$ $cm^{-3}$ or more is the "high concentration region" according to the present invention, whereas any region whose doping concentration is lower than $1\times10^{19}$ $cm^{-3}$ is the "low concentration region".

Next, after supplying $Si_2H_6$ as the source gas 203 and supplying $B_2H_6$ as the p-dopant gas 206 for a predetermined time, $PH_3$ is again supplied as the n-dopant gas 205 instead of the p-dopant gas 206, while still supplying $Si_2H_6$ as the source gas 203. As a result, an n-type high-doping concentration region 107 is formed so as to be continuous with the p-type low-doping concentration region 108 (FIG. 11(b)).

Figure 10:
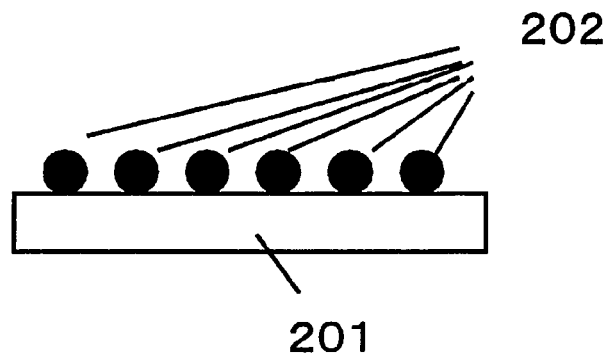
[FIGS. 10] (a) and (b) are diagrams showing a silicon nanowire production method for fabricating a transistor according to the present invention.
Figure 10:
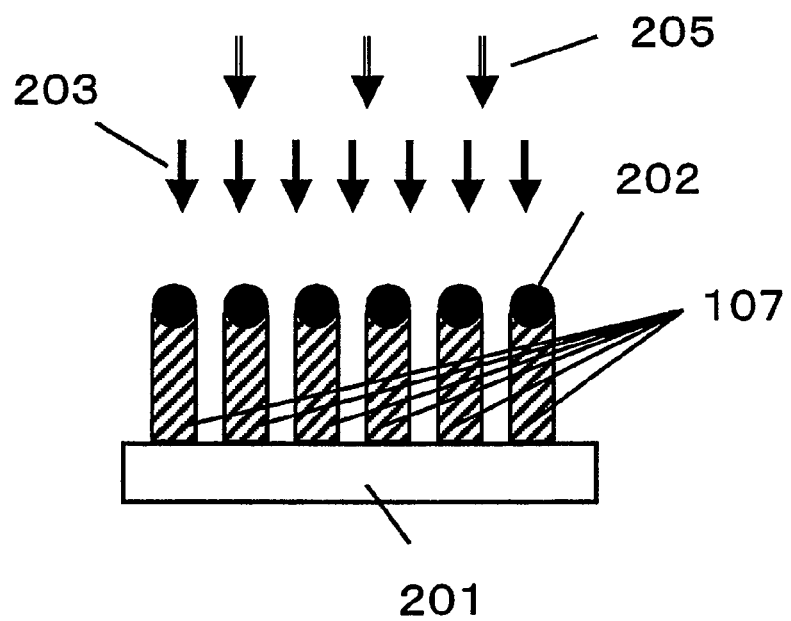
Figure 11:
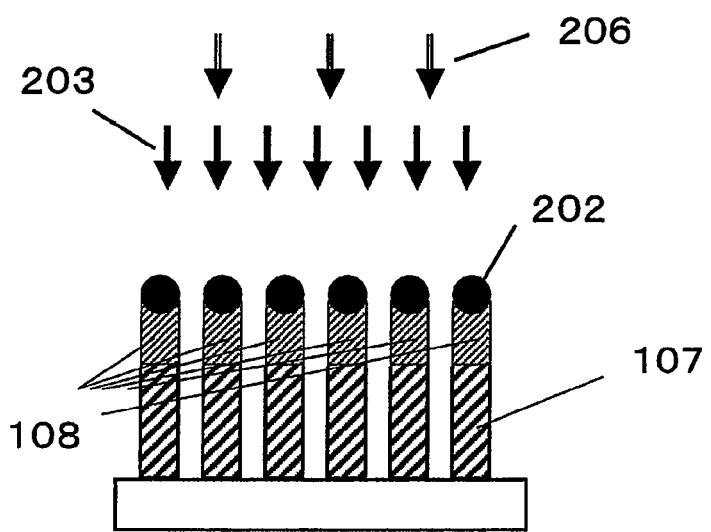
[FIGS. 11] (a) and (b) are diagrams showing a silicon nanowire production method for fabricating a transistor according to the present invention.
Figure 11:
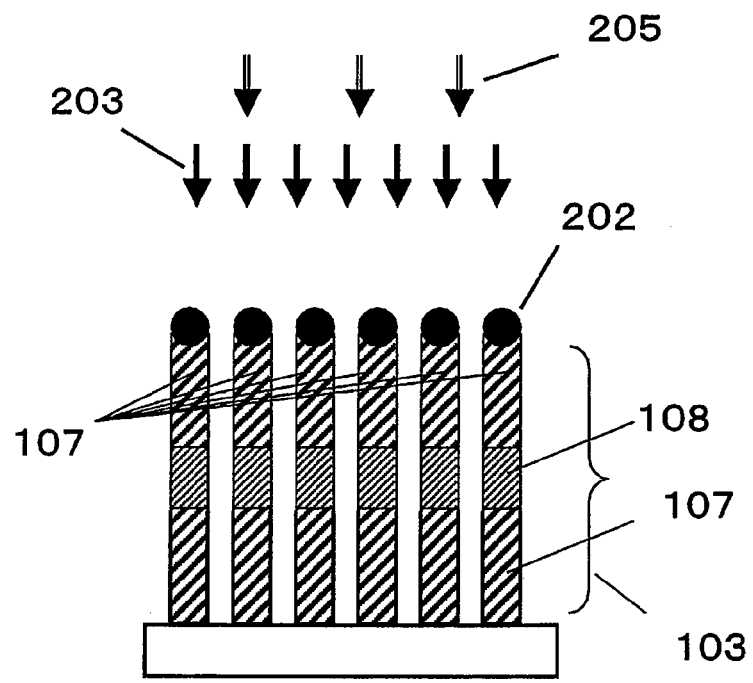

With the aforementioned technique, semiconductor nanostructures with regions of different doping concentrations can be formed. What is to be noted is that the present technique allows the dimensions of the semiconductor nanostructures 103 and the dimensions of the high-doping concentration regions 107 and the low-doping concentration region 108 to be finely controlled through control of the growth time. The typical growth rate of the silicon nanowires is about 1 μm/min to 5 μm/min. For example, in the case where the growth is carried out at 1 μm/min, by performing the growth of the p-type low-doping concentration region 108 as shown in FIG. 11(a) for 6 seconds, its dimensions can be controlled to be 0.1 μm. Growth control in units of several seconds is well within a controllable range, which indicates that the present technique enables a doping profile control with a precision of about 0.1 μm or less. Not only the low-doping concentration region 108, but also the dimensions of the high-doping concentration regions 107 and the entire semiconductor nanostructure 103 can also be controlled with a similar precision. Moreover, although FIG. 10 and FIG. 11 illustrate the case where the high-doping concentration regions 107 is n-type and the low-doping concentration region 108 is p-type, any combination of conductivity types can be supported by selecting the dopant types. Another point to be noted abut the present technique is that, by growing a large quantity of such semiconductor nanostructures 103 on the same substrate, it is possible to generate a large quantity of semiconductor nanostructures 103 having the same profile.

Next, the nanowires having grown are dispersed into a solvent to produce an ink. As a method for producing an ink, for example, the substrate having the nanowires grown thereon may be placed in a solvent and subjected to ultrasonic cleaning; as a result, the nanowires peel into the solvent, and an ink is produced. As the material of the solvent, water, alcohol, organic solvent, or the like can be used. Before producing the ink, processing such as forming an oxide film on the surface of the nanowires may be performed. Moreover, the surface of the nanowires may be chemically modified to facilitate dispersion.

Through the above steps, it is possible to form an ink in which the semiconductor nanostructures 103 having the high-doping concentration regions 107 and the low-doping concentration region 108 formed therein are dispersed. By using this ink, the semiconductor nanostructures 103 are formed on the insulating film 104 as shown in FIG. 8(b). As the method of formation, for example, the ink may be applied onto the entire surface of the substrate 101 by using a spin coating technique or the like, or patterning may be performed by using a printing technique such as the ink jet technique. Upon application, the directions of the semiconductor nanostructures 103 may be aligned by a technique such as flowing the ink in one direction on the substrate surface, or their directions may not be aligned at all. Moreover, the semiconductor nanostructures 103 may be disposed so that there are overlaps between them.

Finally, a source electrode 105 and a drain electrode 106 are formed as shown in FIG. 8(c). As the formation method, for example, a method of using photolithography for defining the regions where the source electrode 105 and the drain electrode 106 are to be formed, or a printing technique such as ink jet may be used to form the source electrode 105 and the drain electrode 106. As the materials of the source electrode 105 and the drain electrode 106, a metal such a gold, titanium, or nickel, an electrically-conductive organic substance, or the like can be used. The typical distance between the source electrode 105 and the drain electrode 106 is about 5 μm to 20 μm. The film thicknesses of the source electrode 105 and the drain electrode 106 are about 100 nm to 500 nm.

In the present invention, semiconductor nanostructures are subjected to local doping in advance, and a field-effect transistor using such semiconductor nanostructures is provided. A feature of the present transistor with respect to its production method is that semiconductor nanostructures subjected to local doping are fabricated in advance and thereafter made into an ink, and that a transistor is formed on another substrate by using a printing technique. In the case where semiconductor nanostructures are thus subjected to local doping in advance and the semiconductor nanostructures are thus disposed between the source electrode and the drain electrode of a transistor to fabricate the transistor, there is a fear that their positioning discrepancies may change the structure of the transistor and change the characteristics thereof. Therefore, a preferable transistor structure was inferred, concerning the length of a semiconductor nanostructure, the lengths of doped regions, and the dimensions of the transistor. Silicon nanowires were the assumed semiconductor nanostructure material used for the inference.

Figure 2:
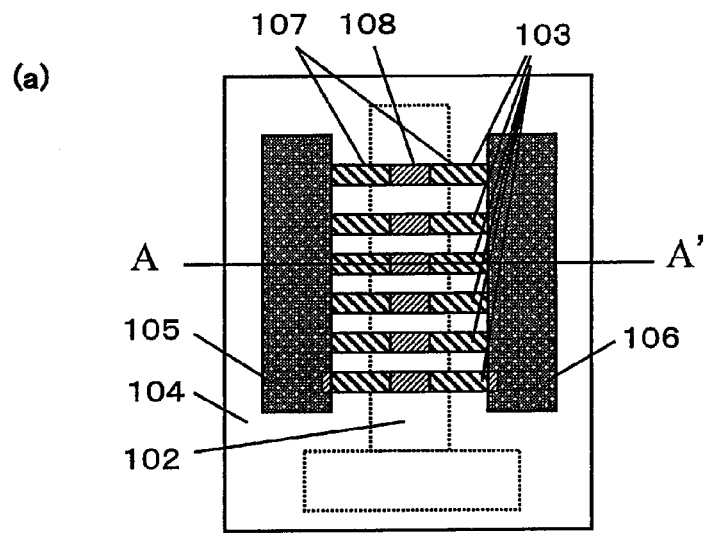
[FIG. 2] (a) is an upper plan view of a bottom-gate type transistor structure according to the present invention; and (b) is a cross-sectional view taken along line A-A'.
Figure 2:
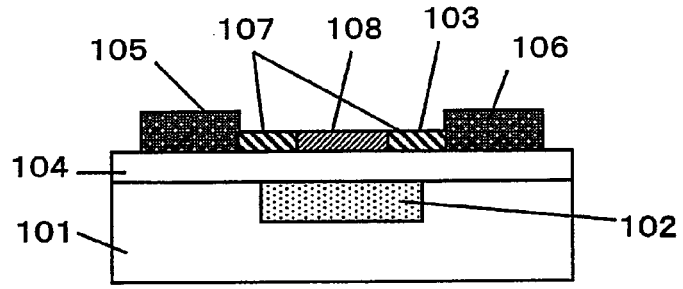
Figure 12:
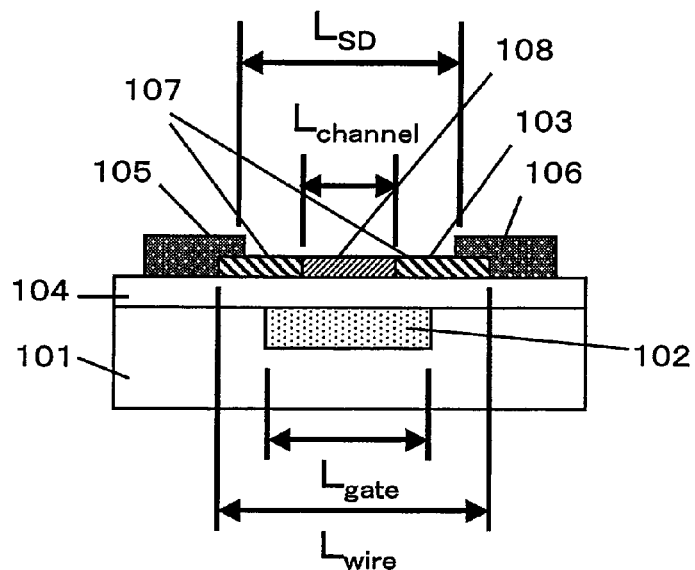
[FIG. 12] A cross-sectional view of a bottom-gate type transistor structure according to the present invention.

FIG. 12 shows a cross-sectional structure of the transistor shown in FIG. 2. In order to define the relative dimensions of the respective portions of the transistor, the length of a semiconductor nanostructure 103 will hereinafter be denoted as $L_{wire}$; the length of the low-doping concentration region 108 in the semiconductor nanostructure 103 as $L_{channel}$; the length of the gate electrode 102 as $L_{gate}$; and the distance between the source electrode 105 and the drain electrode 106 as $L_{SD}$. In this transistor, the influences which the positioning discrepancies of the semiconductor nanostructures 103 exert on the device characteristics were determined by using a device simulation. In the simulation, the length of the gate electrode 102 was 2 μm, and the distance of the source electrode 105 and the drain electrode 106 was 5 μm. The high-doping concentration regions 107 at both ends of each semiconductor nanostructure 103 were n-regions with a concentration of $1 \times 10^{21}$ cm$^{-3}$, and the low-doping concentration region 108 in the central portion of the nanowire 204 was a p-region with a concentration of $1 \times 10^{16}$ cm$^{-3}$ and a length of 1 μm.

Figure 13:
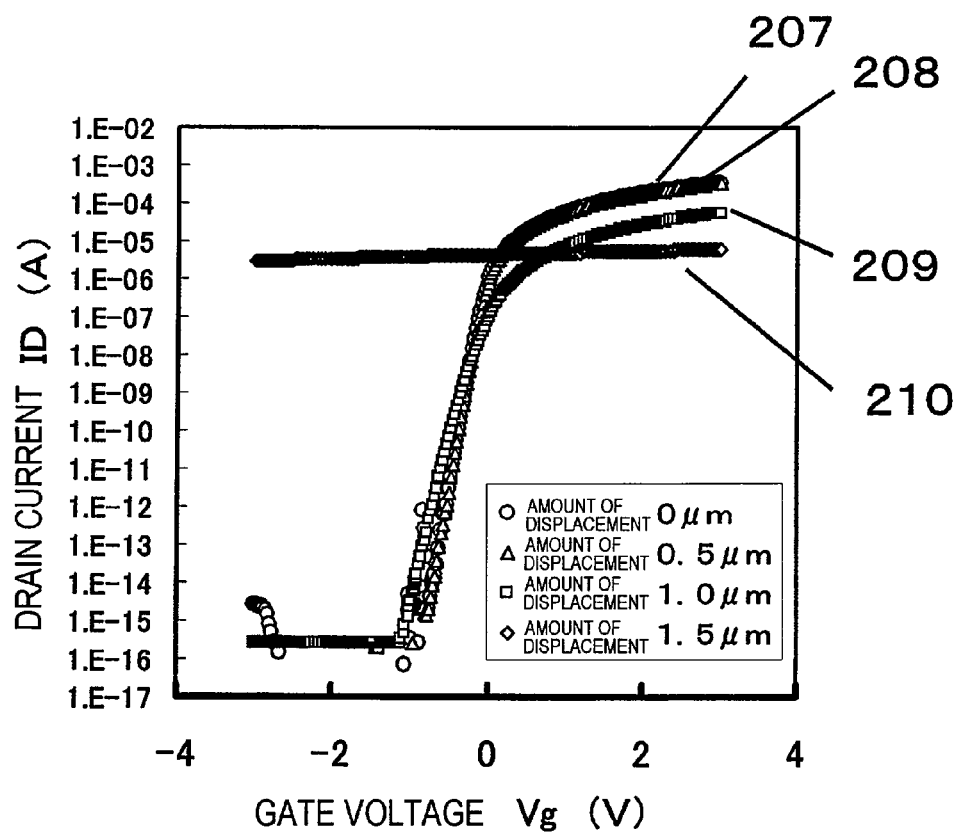
[FIG. 13] An explanatory diagram of simulation results concerning drain current-gate voltage characteristics.

FIG. 13 shows changes in drain current-gate voltage characteristics relative to the amount of positional change, in the case where the dimensions and positions of the gate electrode 102, the source electrode 105, and the drain electrode 106 were fixed and the relative positions of the nanowires were changed in the direction of the drain from the center. As for the amount of positional displacement, the simulation of transistor characteristics was carried out while making displacements in the direction of the drain electrode with steps of 0.25 μm up to 2 μm, against a reference, i.e., when the low-doping concentration region 108 in the central portion of the semiconductor nanostructure 103 is in the middle between the source electrode and the drain electrode (amount of displacement: 0). FIG. 13 shows drain current-gate voltage characteristics 207 in the case where the amount of displacement is 0 μm; drain current-gate voltage characteristics 208 in the case where the amount of displacement is 0.5 μm; drain current-gate voltage characteristics 209 in the case where the amount of displacement is 1.0 μm; and drain current-gate voltage characteristics 210 in the case where the amount of displacement is 1.5 μm. In the case where the amount of displacement is 0 μm, good n-channel transistor characteristics are exhibited. Also in the case where the amount of displacement is 0.5 μm, good n-channel transistor characteristics almost identical to those in the case where the amount of displacement is 0 μm are exhibited. As the nanowire positions are displaced, changes occur in the transistor characteristics. Hardly any difference between the ON and OFF states of the transistor is observed when the amount of displacement exceeds 1.5 μm, which indicates a failure of operation as a transistor.

Figure 14:
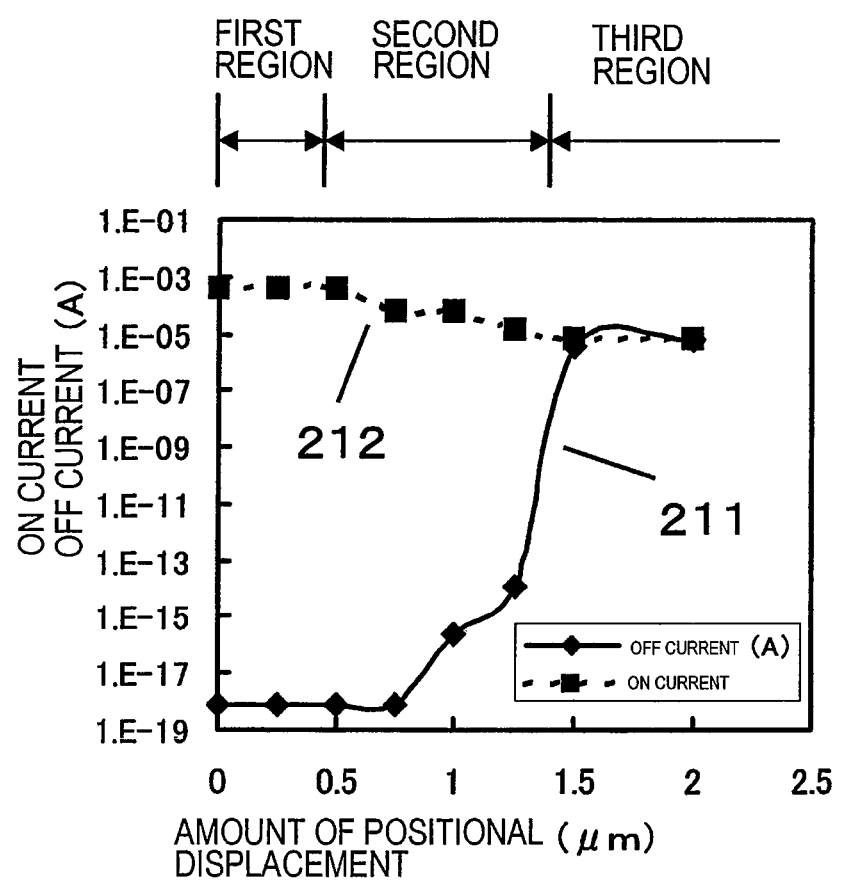
[FIG. 14] An explanatory diagram of the dependence of an ON current and an OFF current on the amount of positional displacement of nanowires.

In order to analyze the particulars of the changes in transistor characteristics relative to the amount of displacement, the dependence of the ON current and OFF current on the amount of positional displacement was plotted. FIG. 14 shows changes in an OFF current 211 and an ON current 212 of the transistor relative to the amount of positional displacement of the semiconductor nanostructures 103. Generally, three following regions were observed. A first region is a range in which the amount of positional displacement is 0 μm to 0.5 μm, where the OFF current 211 stably has a value as low as $10^{-17}$ A or less and the ON current 212 stably has a value as high as $10^{-4}$ A or more. A second region is a range in which the amount of positional displacement is 0.5 μm to 1.5 μm, where the OFF current 211 gradually increases and the ON current 212 gradually decreases with increase in the amount of positional displacement. A third region is a region in which the amount of positional displacement is 1.5 μm or more, where the OFF current 211 and the ON current 212 are both about $8 \times 10^{-6}$ A, i.e., a region where the transistor does not perform any ON/OFF operation.

Figure 15:
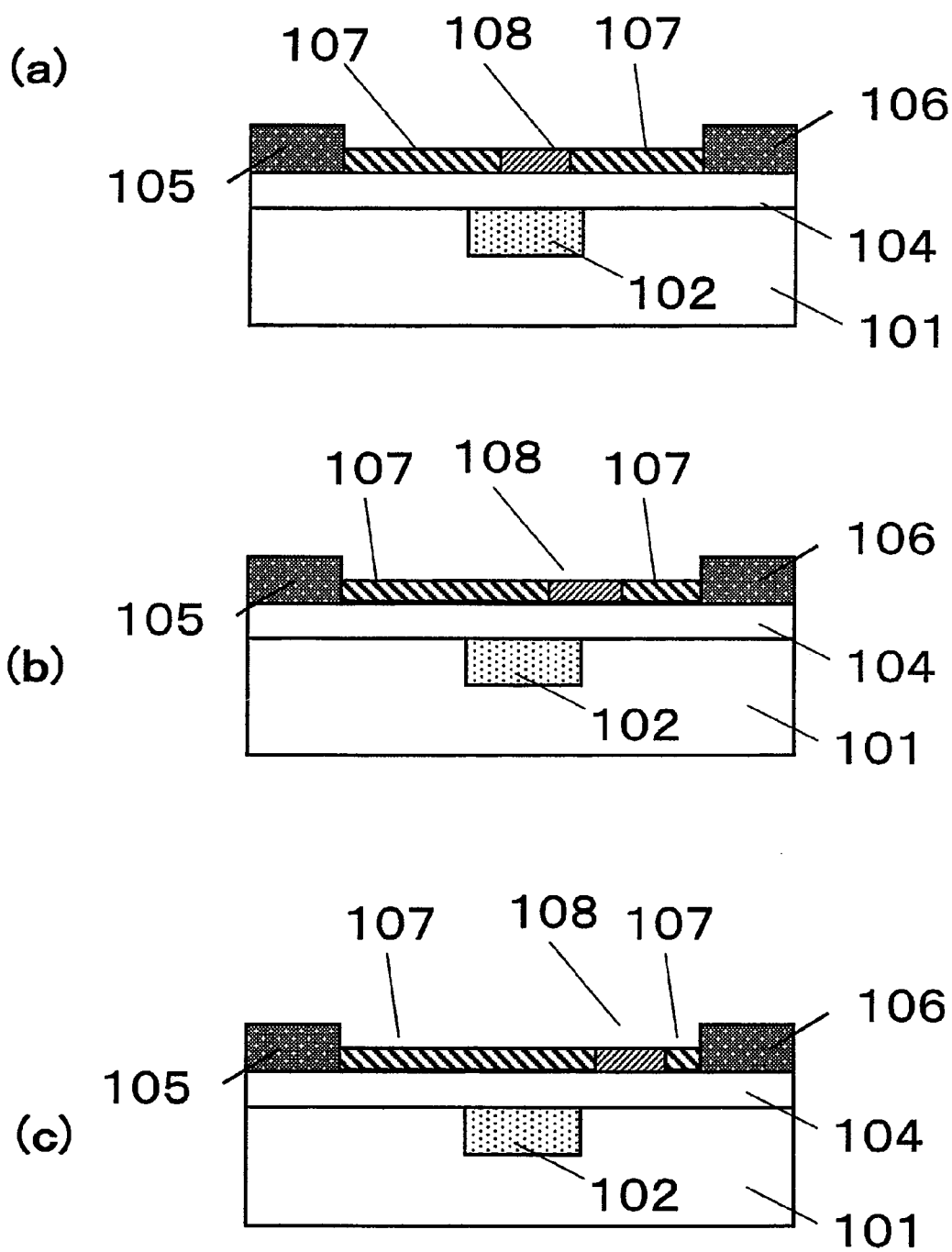
[FIG. 15] Explanatory diagrams of positional displacement of nanowires and relative positioning with respect to a gate electrode, where: (a) shows a case where the entire low-doping concentration region overlaps the gate electrode; (b) shows a case where a portion of the low-doping concentration region overlaps the gate electrode; and (c) shows a case where the low-doping concentration region entirely lacks overlap with the gate electrode.

The reason why such three regions are observed can be explained as follows. Since the low-doping concentration region 108 is 1 μm and the gate electrode 102 is 2 μm, in the range where the amount of positional displacement is 0 μm to 0.5 μm, the entire low-doping concentration region 108 overlaps the gate electrode 102 (FIG. 15(a)). Therefore, the entire low-doping concentration region 108 is governed by the gate voltage, thus resulting in transistor characteristics with a good ON/OFF ratio. In the range where the amount of positional displacement is 0.5 μm to 1.5 μm, a portion of the low-doping concentration region 108 overlaps the gate electrode 102 and a portion thereof does not overlap the gate electrode 102 (FIG. 15(b)). Since a portion of the low-doping concentration region 108 is not governed by the gate voltage, the OFF current 211 increases and the ON current 212 decreases to result in deteriorated characteristics, although a transistor operation occurs. As an explanation for the region where the amount of positional displacement is 1.5 μm or more, overlap between the low-doping concentration region 108 and the gate electrode 102 is entirely eliminated (FIG. 15(c)), thus being no longer governed by the gate voltage and causing a failure of transistor operation.

The foregoing has been described by using values which are based on simulation results. However, the phenomenon that has been clarified above can be generalized as follows. In a transistor construction where semiconductor nanostructures 103 with high-doping concentration regions 107 formed at both ends and a low-doping concentration region 108 formed in the central portion are used as a channel, it is most desirable that the low-doping concentration region 108 is positioned so as to entirely overlap the gate electrode 102, whereby good transistor characteristics are obtained. In an arrangement where a portion of the low-doping concentration region 108 overlaps the gate electrode and a portion thereof has no overlap with the gate electrode, a transistor operation will be obtained but with inferior characteristics. In an arrangement where the low-doping concentration region 108 entirely lacks overlap with the gate electrode 102, it does not function as a transistor.

The above results indicate that, in the case of forming the high-doping concentration regions 107 and the low-doping concentration region 108 into the semiconductor nanostructures 103 in advance and thereafter fabricating a transistor by using the semiconductor nanostructures 103, it is most preferable that the low-doping concentration region 108 is positioned so as to entirely overlap the gate electrode 102, and that an arrangement is required in which at least a portion of the low-doping concentration region 108 overlaps the gate electrode 102. When fabricating a transistor through a printing technique by using semiconductor nanostructures 103 that have been fabricated on another substrate, a high level of positioning precision is needed in order to satisfy the above requirements. With conventional techniques, no method has been realized that dispose semiconductor nanostructures with a good precision and through an easy process.

Through an inference as set forth below, we have found that it is possible to realize a transistor which attains improved characteristics without requiring a high level of positioning precision, by satisfying the following relational expressions between the length $L_{wire}$ of a semiconductor nanostructure 103, the length $L_{channel}$ of the low-doping concentration region 108 in the semiconductor nanostructure 103, the length $L_{gate}$ of the gate electrode 102, and the distance $L_{SD}$ between the source electrode 105 and the drain electrode 106. Note that this study was conducted by assuming that the low-doping concentration region 108 is located in the center of the semiconductor nanostructure 103 and the high-doping concentration regions 107 are formed symmetrically with respect to the low-doping concentration region 108 interposed therebetween.

Firstly, as a most preferable condition, a condition for realizing an arrangement in which the low-doping concentration region 108 entirely overlaps the gate electrode 102 is determined. In order for the low-doping concentration region 108 ($L_{channel}$) to entirely overlap the gate electrode 102 ($L_{gate}$), $$L_{gate} > L_{channel} \quad (1)$$

must be satisfied. Moreover, since it is necessary for the nanowire 204 ($L_{wire}$) to connect to the source electrode 105 and the drain electrode 106 (electrode interspace $L_{SD}$), $$L_{wire} > L_{SD} \quad (2)$$

must be satisfied.

Note that the length $L_{gate}$ of the gate electrode 102 is the size of the gate electrode 102 as measured along a direction extending from the source electrode 105 to the drain electrode 106, and is smaller than the distance $L_{SD}$ between the source electrode 105 and the drain electrode 106.

Figure 16A:
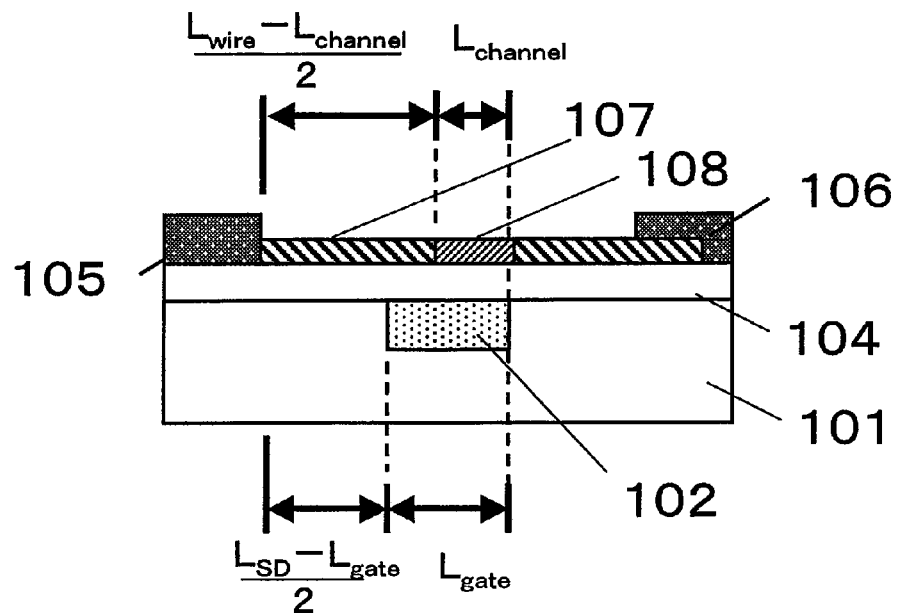
[FIG. 16A] A diagram showing a condition for the entire low-doping concentration region to overlap the gate electrode.
Figure 16B:
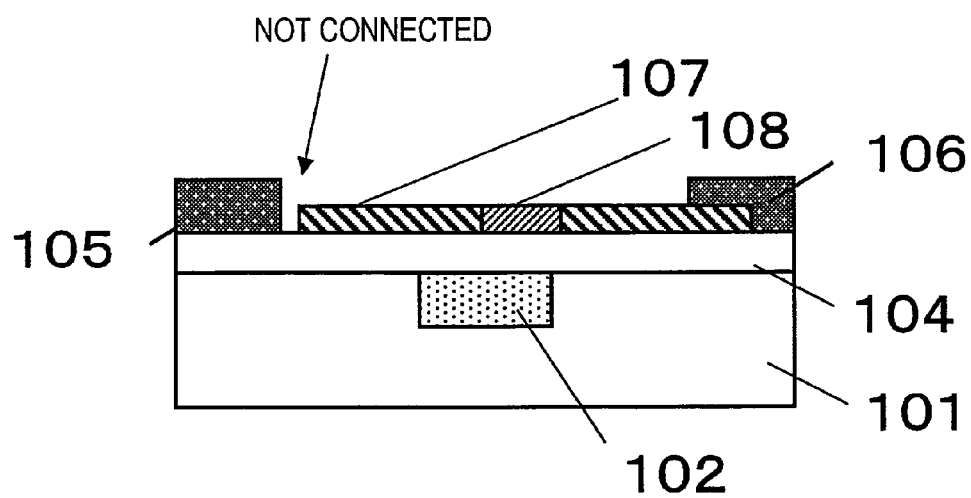
[FIG. 16B] A diagram showing a condition for the entire low-doping concentration region to overlap the gate electrode.

It has been described earlier that, when a nanowire 204 is displaced in position so that its low-doping concentration region 108 has no overlap with the gate electrode 102, deteriorations in the transistor characteristics will occur, e.g., an increase in the OFF current. In an arrangement where the low-doping concentration region 108 has no overlap with the gate electrode 102, we have found a condition for that nanowire to automatically lose connection with the source electrode or the drain electrode and fail to contribute to an increase in the OFF current. Specifically, as shown in FIG. 16A, a case is contemplated where the dimension ($L_{gate}+(L_{SD}-L_{gate})/2$) from an end of the source electrode 105 to an end of the gate electrode 102 closer to the drain electrode is exactly equal to a sum of the low-doping concentration region 108 ($L_{channel}$) and the dimension of one of the high-doping concentration regions 107 ($L_{channel}+(L_{wire}-L_{channel})/2$). At this point, the low-doping concentration region 108 entirely overlaps the gate electrode 102, and contributes to the transistor characteristics. If the amount of displacement of such a semiconductor nanostructure 103 becomes slightly greater, even slightly, as shown in FIG. 16B, the low-doping concentration region 108 will be spreading outside of its overlap with the gate electrode 102, but at the same time will lose connection at the source electrode end, so that, automatically, the semiconductor nanostructure 103 will no longer contribute to the transistor characteristics. In other words, in an arrangement where the low-doping concentration region 108 has no overlap with the gate electrode 102, the condition for that nanowire to automatically lose connection with the source electrode or the drain electrode can be stated in a mathematical expression as follows:

$$L_{gate}+(L_{SD}-L_{gate})/2 > L_{channel}+(L_{wire}-L_{channel})/2. \quad (3)$$

This inequality can be described more simply as:

$$(L_{gate}-L_{channel}) > (L_{wire}-L_{SD}). \quad (4)$$

By fabricating a transistor so as to satisfy this condition, it is ensured that any semiconductor nanostructure whose amount of positional displacement is large enough to cause a deterioration in the characteristics of the transistor has no contribution to the characteristics of the transistor at all. As a result, deteriorations in the characteristics will not occur.

In the case where a plurality of semiconductor nanostructures are used to fabricate a transistor, if the arrangement of the semiconductor nanostructures is not controlled at all but they are randomly disposed, with a certain statistical probability, there will emerge some semiconductor nanostructures whose low-doping concentration region 108 has an overlap with the gate electrode 102 and others whose low-doping concentration region 108 has no overlap with the gate electrode 102. By ensuring that the conditions described by eq. (1), (2) and (4) above are satisfied between $L_{gate}$, $L_{channel}$, $L_{wire}$, and $L_{SD}$, it is automatically ensured that those whose low-doping concentration region 108 has no overlap with the gate electrode 102 do not contribute to a deterioration in the characteristics, so that characteristics which are dependent on the certain statistical probability will be stably obtained as the transistor characteristics. In order to obtain stable transistor characteristics, it is necessary to compose the channel from a plurality of semiconductor nanostructures. Preferably, the channel is composed of 10 or more semiconductor nanostructures, and more preferably of 100 or more semiconductor nanostructures.

Figure 17:
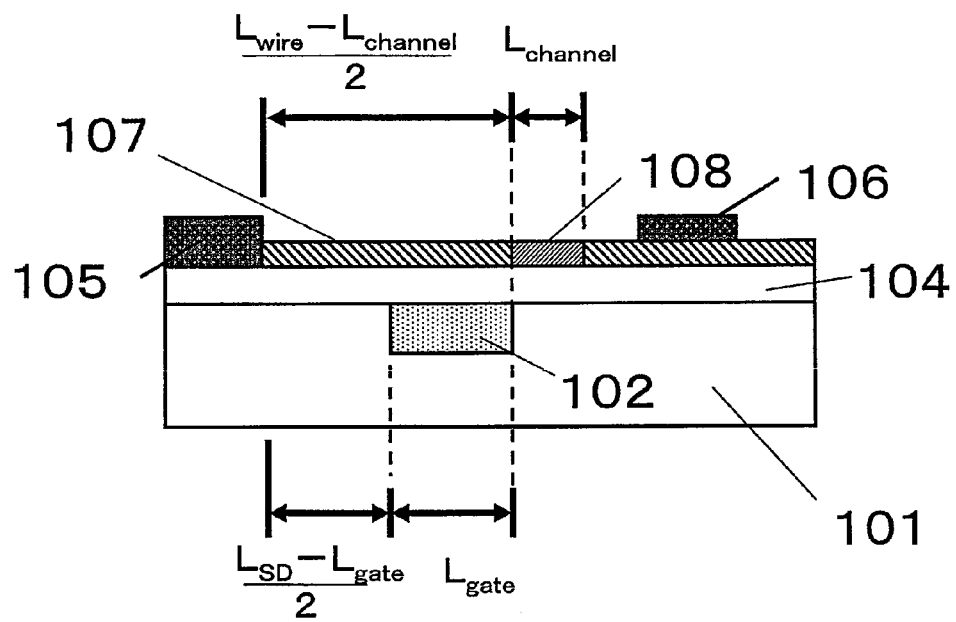
[FIG. 17] A diagram showing a condition for a portion of the low-doping concentration region to overlap the gate electrode.

Next, as a preferable condition, a condition for realizing an arrangement in which a portion of the low-doping concentration region 108 overlaps the gate electrode 102 is determined. In this case, in an arrangement in which a portion of the low-doping concentration region 108 has no overlap with the gate electrode 102, a condition has been found for that nanowire to automatically lose connection with the source electrode or the drain electrode. Specifically, as shown in FIG. 17, a case is contemplated where the dimension ($L_{gate}+(L_{SD}-L_{gate})/2$) from an end of the source electrode 105 to an end of the gate electrode 102 closer to the drain electrode is exactly equal to the dimension (($L_{wire}-L_{channel})/2$) of one of the high-doping concentration regions 107. At this point, the low-doping concentration region 108 partly has an overlap with the gate electrode 102, and contributes to the transistor characteristics. If the amount of displacement of the semiconductor nanostructure 103 becomes greater, even slightly, the low-doping concentration region 108 will be spreading outside of its overlap with the gate electrode 102, but at the same time will lose connection at the source electrode end, so that, automatically, the semiconductor nanostructure 103 will no longer contribute to the transistor characteristics. In other words, in an arrangement where the low-doping concentration region 108 has no overlap with the gate electrode 102, the condition for that nanowire to automatically lose connection with the source electrode or the drain electrode can be stated in a mathematical expression as follows:

$$L_{gate}+(L_{SD}-L_{gate})/2>(L_{wire}-L_{channel})/2. \quad (5)$$

This inequality can be described more simply as:

$$(L_{gate}+L_{channel})>(L_{wire}-L_{SD}). \quad (6)$$

By ensuring that the conditions described by eq. (1), (2) and (5) above are satisfied between $L_{gate}$, $L_{channel}$, $L_{wire}$, and $L_{SD}$, characteristics which are dependent on a certain statistical probability will be stably obtained as the transistor characteristics. When using eq. (5), any semiconductor nanostructure that is disposed so that a portion of its low-doping concentration region 108 overlaps the gate electrode 102 will also contribute to the transistor characteristics; therefore, the characteristics will be inferior to those of the transistor defined by eq. (4).

Silicon nanowires are illustrated as a typical semiconductor nanostructure material in the above-described embodiments; however, the effects of the present invention will be obtained with any kind of semiconductor material, without being limited to silicon nanowires. For example, as the material, without being limited to silicon, IV-group semiconductors such as germanium and silicon carbide, compound semiconductors such as gallium arsenide and indium phosphorus, or oxide semiconductors such as zinc oxide may be used to produce similar effects. Moreover, similar effects can be obtained with semiconductor nanostructures which have been fabricated by other growth methods or semiconductor nanostructures which have been fabricated by micromachining, without being limited to nanowires through VLS growth. Although it is desirable that the semiconductor nanostructures are single-crystalline, similar effects can also be obtained even if they are polycrystalline or amorphous.

Figure 18:
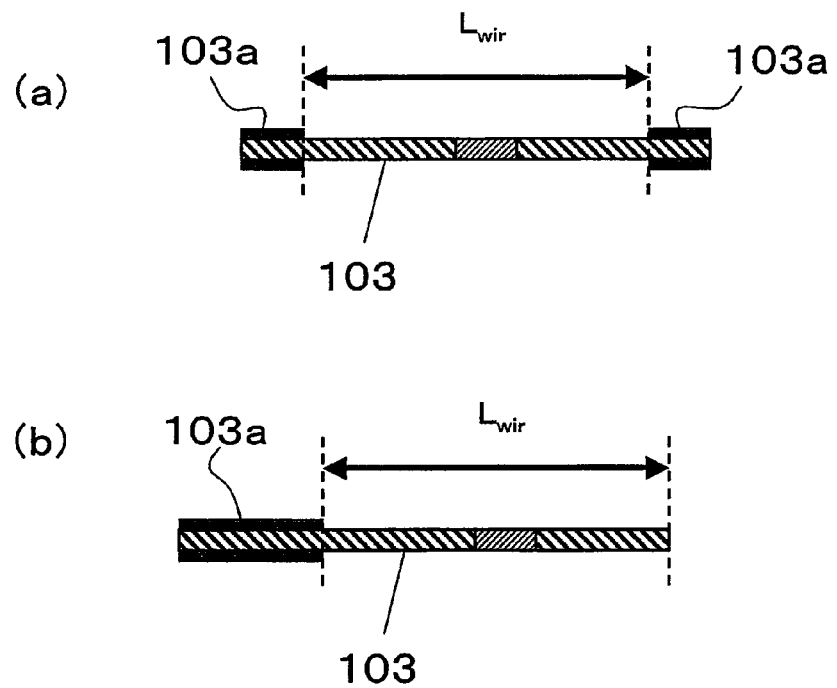
[FIGS. 18] (a) and (b) are cross-sectional views showing an example of a semiconductor nanostructure 103 at least one end of which is insulated.
Figure 19:
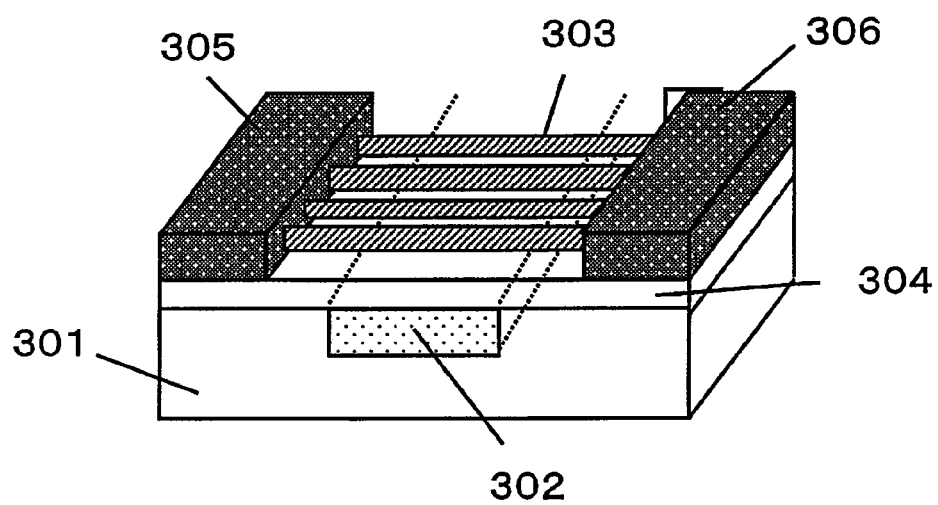
[FIG. 19] A perspective view of a bottom-gate type transistor structure according to a conventional technique.
Figure 20:
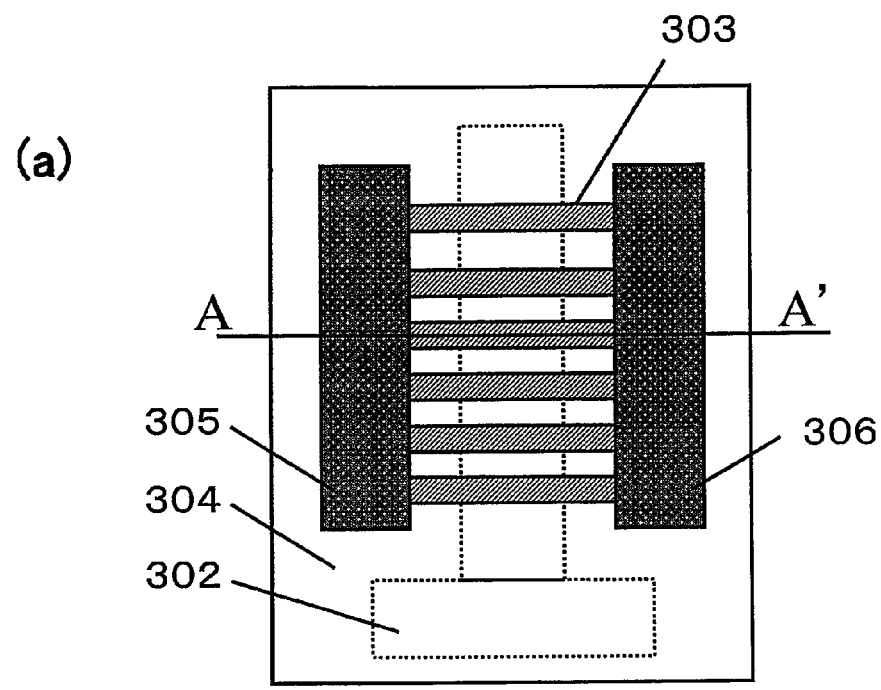
[FIG. 20] (a) is an upper plan view of a bottom-gate type transistor structure according to a conventional technique, and (b) is a cross-sectional view thereof.
Figure 20:
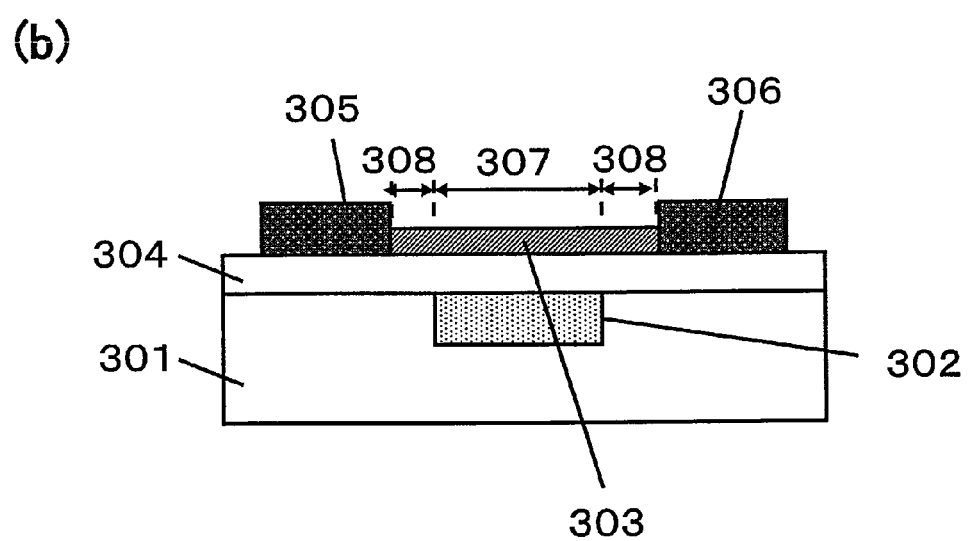
Figure 21:
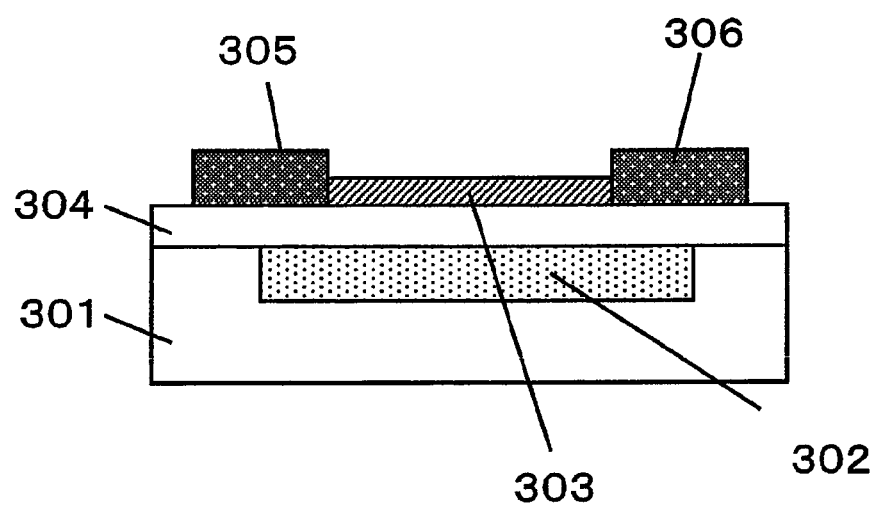
[FIG. 21] A cross-sectional view of a bottom-gate type transistor structure according to a conventional technique.

Note that, as shown in FIG. 18, each semiconductor nanostructure may have a portion(s) 103a whose surface is insulated at both ends or one end thereof. In that case, the insulated end(s) 103a is not in electrical contact with the source electrode/drain electrode. For this reason, the aforementioned length $L_{wire}$ of the semiconductor nanostructure will be defined so as to exclude the end(s) 103a at least whose surface is insulated, as illustrated in FIG. 18.

INDUSTRIAL APPLICABILITY

A field-effect transistor according to the present invention is applicable in a broad range, such as displays, logic integrated circuits, and mobile devices.

The invention claimed is:

1. A field-effect transistor comprising:
a substrate;
a plurality of semiconductor nanostructures supported by the substrate;
a source electrode connected to a portion of at least one semiconductor nanostructure among the plurality of semiconductor nanostructures;
a drain electrode connected to another portion of the at least one semiconductor nanostructure;
an insulating film adjoining the at least one semiconductor nanostructure and functioning as a gate insulating film; and
a gate electrode being capable of controlling electrical conduction of the at least one semiconductor nanostructure via the insulating film, wherein,
each of the plurality of semiconductor nanostructures includes a low concentration region having a relatively low doping concentration and a pair of high concentration regions having a higher doping concentration than that of the low concentration region and being connected to both ends of the low concentration region;
the doping concentration of the high concentration region is $1\times10^{19}$ cm$^{-3}$ or more; and
a length of the low concentration region is shorter than a length of the gate electrode along a direction from the source electrode to the drain electrode, and the length of the gate electrode is shorter than an interspace between the source electrode and the drain electrode,
wherein the length of the semiconductor nanostructures is longer than an interspace between the source electrode and the drain electrode.

2. The field-effect transistor of claim 1, wherein, one of the pair of high concentration regions of the at least one semiconductor nanostructure is connected to the source electrode; the other of the pair of high concentration regions is connected to the drain electrode; and at least a portion of the low concentration region has an overlap with the gate electrode.

3. The field-effect transistor of claim 1, wherein, one of the pair of high concentration regions of the at least one semiconductor nanostructure is connected to the source electrode; the other of the pair of high concentration regions is connected to the drain electrode;
and the entire low concentration region has an overlap with the gate electrode.

4. The field-effect transistor of claim 1, wherein the following relational expression is satisfied:

$$(L_{gate}-L_{channel})>(L_{wire}-L_{SD}), \text{ where:}$$

$L_{wire}$ is a length of the semiconductor nanostructure;
$L_{channel}$ is the length of the low concentration region;
$L_{gate}$ is the length of the gate electrode; and
$L_{SD}$ is the interspace between the source electrode and the drain electrode.

5. The field-effect transistor of claim 1, wherein the following relational expression is satisfied:

$$(L_{gate}+L_{channel})>(L_{wire}-L_{SD}), \text{ where:}$$

$L_{wire}$ is a length of the semiconductor nanostructure;
$L_{channel}$ is the length of the low concentration region;
$L_{gate}$ is the length of the gate electrode; and
$L_{SD}$ is the interspace between the source electrode and the drain electrode.

6. The field-effect transistor of claim 1, wherein the doping concentration of the high concentration region is in a range from $1\times10^{19}$ to $1\times10^{22}$ cm$^{-3}$; and
the doping concentration of the low concentration region is 10% or less of the doping concentration of the high concentration region.

7. The field-effect transistor of claim 6, wherein the doping concentration of the low concentration region is in a range from $1\times10^{15}$ to $1\times10^{19}$ cm$^{-3}$.

8. The field-effect transistor of claim 1, wherein the plurality of semiconductor nanostructures include at least one semiconductor nanostructure which has no overlap with one of the source electrode and the drain electrode.

9. The field-effect transistor of claim 8, wherein the low concentration region of the at least one semiconductor nanostructure which has no overlap with one of the source electrode and the drain electrode has no overlap with the gate electrode.

10. The field-effect transistor of claim 1, wherein the semiconductor nanostructure is a semiconductor nanowire.

11. The field-effect transistor of claim 1, wherein the semiconductor nanostructure is a semiconductor nanowire which is fabricated by vapor-liquid-solid growth (VLS growth).

12. The field-effect transistor of claim 1, wherein the semiconductor nanostructure is a silicon nanowire which is fabricated by vapor-liquid-solid growth (VLS growth).

13. The field-effect transistor of claim 1, wherein the substrate is made of an organic material.

14. The field-effect transistor of claim 1, wherein the source electrode and the drain electrode overlap with the plurality of semiconductor nanostructures.

15. The field-effect transistor of claim 1, wherein the semiconductor nanostructures are nanowires, and the semiconductor nanostructures are arranged in a different direction from the direction from the source electrode toward the drain electrode.

16. A field-effect transistor comprising:
a substrate;
a plurality of semiconductor nanostructures supported by the substrate;
a source electrode connected to a portion of at least one semiconductor nanostructure among the plurality of semiconductor nanostructures;
a drain electrode connected to another portion of the at least one semiconductor nanostructure;
an insulating film adjoining the at least one semiconductor nanostructure and functioning as a gate insulating film; and
a gate electrode being capable of controlling electrical conduction of the at least one semiconductor nanostructure via the insulating film, wherein,
each of the plurality of semiconductor nanostructures includes a low concentration region having a relatively low doping concentration and a pair of high concentration regions having a higher doping concentration than that of the low concentration region and being connected to both ends of the low concentration region;
the doping concentration of the high concentration region is $1 \times 10^{19}$ cm$^{-3}$ or more; and
a length of the low concentration region is shorter than a length of the gate electrode along a direction from the source electrode to the drain electrode, and the length of the gate electrode is shorter than an interspace between the source electrode and the drain electrode,
wherein at least one of the plurality of semiconductor nanostructures are connected to the source electrode and the drain electrode,
in at least one of the plurality of semiconductor nanostructures, the low concentration region has an overlap with the gate electrode,
and at least one of the plurality of semiconductor nanostructures have no connection with the source electrode or the drain electrode.

17. The field-effect transistor of claim 16, wherein, one of the pair of high concentration regions of the at least one semiconductor nanostructure is connected to the source electrode; the other of the pair of high concentration regions is connected to the drain electrode; and at least a portion of the low concentration region has an overlap with the gate electrode.

18. The field-effect transistor of claim 16, wherein, one of the pair of high concentration regions of the at least one semiconductor nanostructure is connected to the source electrode; the other of the pair of high concentration regions is connected to the drain electrode;
and the entire low concentration region has an overlap with the gate electrode.

19. The field-effect transistor of claim 16, wherein the following relational expression is satisfied:

$$(L_{gate} - L_{channel}) > (L_{wire} - L_{SD}), \text{ where:}$$

$L_{wire}$ is a length of the semiconductor nanostructure;
$L_{channel}$ is the length of the low concentration region;
$L_{gate}$ is the length of the gate electrode; and
$L_{SD}$ is the interspace between the source electrode and the drain electrode.

20. The field-effect transistor of claim 16, wherein the following relational expression is satisfied:

$$(L_{gate} + L_{channel}) > (L_{wire} - L_{SD}), \text{ where:}$$

$L_{wire}$ is a length of the semiconductor nanostructure;
$L_{channel}$ is the length of the low concentration region;
$L_{gate}$ is the length of the gate electrode; and
$L_{SD}$ is the interspace between the source electrode and the drain electrode.

* * * * *